(12) United States Patent
Sato

(10) Patent No.: US 12,063,863 B2
(45) Date of Patent: Aug. 13, 2024

(54) DRIVE CIRCUIT, ELECTRONIC DEVICE, AND METHOD OF CONTROLLING DRIVE CIRCUIT

(71) Applicant: Sony Group Corporation, Tokyo (JP)

(72) Inventor: Masahiro Sato, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 720 days.

(21) Appl. No.: 17/282,228

(22) PCT Filed: Sep. 20, 2019

(86) PCT No.: PCT/JP2019/036932
§ 371 (c)(1),
(2) Date: Apr. 1, 2021

(87) PCT Pub. No.: WO2020/095550
PCT Pub. Date: May 14, 2020

(65) Prior Publication Data
US 2021/0351336 A1    Nov. 11, 2021

(30) Foreign Application Priority Data
Nov. 5, 2018    (JP) ................. 2018-208340

(51) Int. Cl.
*H10N 30/80*    (2023.01)
*H02M 3/24*    (2006.01)
(Continued)

(52) U.S. Cl.
CPC ............ *H10N 30/802* (2023.02); *H02M 3/24* (2013.01); *H02M 7/493* (2013.01); *H02N 2/06* (2013.01)

(58) Field of Classification Search
CPC ...... H10N 30/802; H02M 3/24; H02M 7/493; H02M 1/008; H02M 7/53871;
(Continued)

(56) References Cited

U.S. PATENT DOCUMENTS 5,252,907 A    10/1993   Harris
5,260,607 A    11/1993   Kinbara
(Continued)

FOREIGN PATENT DOCUMENTS

CN    1347190 A    5/2002
CN    102025339 A    4/2011
(Continued)

OTHER PUBLICATIONS

International Search Report issued in International Patent Application No. PCT/JP2019/036932 on Dec. 3, 2019 and English translation of same. 5 pages.

(Continued)

*Primary Examiner* — Jung Kim
(74) *Attorney, Agent, or Firm* — K&L Gates LLP

(57) ABSTRACT

A drive circuit, an electronic device, and a method of controlling a drive circuit that can reduce power consumption. The drive circuit includes: a control circuit that controls application of an AC voltage to a capacitive load; an inductive element which constitutes a closed circuit along with the capacitive load; a diode, which is connected in series to the inductive element between the capacitive load and the inductive element so as to constitute the closed circuit; and a switch element, which is connected in series to the diode between the capacitive load and the inductive element so as to constitute the closed circuit.

16 Claims, 13 Drawing Sheets

(51) Int. Cl.
*H02M 7/493* (2007.01)
*H02N 2/06* (2006.01)

(58) Field of Classification Search
CPC .. H02M 7/4811; H02M 7/537; H02M 1/0048; H02N 2/06; H02N 2/067; Y02B 70/10; H03K 17/68
See application file for complete search history.

(56) References Cited

U.S. PATENT DOCUMENTS

| | | | |
|---|---|---|---|
| 5,847,941 | A | 12/1998 | Taguchi |
| 5,977,756 | A | 11/1999 | Nagata |
| 6,057,631 | A | 5/2000 | Kouno |
| 2002/0075700 | A1 | 6/2002 | Birumachi |
| 2012/0294056 | A1 | 11/2012 | Temesi |
| 2015/0162822 | A1* | 6/2015 | Ho ..................... H02M 1/4225 363/89 |

FOREIGN PATENT DOCUMENTS

| | | |
|---|---|---|
| CN | 102290992 A | 12/2011 |
| CN | 104518666 A | 4/2015 |
| CN | 106787753 A | 5/2017 |
| JP | H08-251926 A | 9/1996 |
| JP | H11-206147 A | 7/1999 |
| JP | H11205114 A | 7/1999 |
| JP | 2001-136749 A | 5/2001 |
| JP | 2004-265647 A | 9/2004 |
| JP | 2012100529 A | 5/2012 |
| JP | 2015-159724 A | 9/2015 |
| KR | 20030037390 A | 5/2003 |

OTHER PUBLICATIONS

Written Opinion issued in International Patent Application No. PCT/JP2019/036932 on Dec. 3, 2019. 4 pages.

* cited by examiner

DRIVE CIRCUIT, ELECTRONIC DEVICE, AND METHOD OF CONTROLLING DRIVE CIRCUIT

TECHNICAL FIELD

The present technique relates to a drive circuit, an electronic device, and a method of controlling a drive circuit.

BACKGROUND ART

Conventionally, capacitive loads such as piezoelectric actuators have been used to displace members such as lenses in image capturing devices, robots, and the like. For example, as a circuit for driving such a capacitive load, a drive circuit has been proposed in which a drive signal is amplified by a non-inverting amplifier circuit and supplied to the positive terminal of the capacitive load, and the signal is then inverted by an inverting amplifier circuit and supplied to the negative terminal of the capacitive load (see, for example, PTL 1).

CITATION LIST

Patent Literature

[PTL 1]
JP 2015-159724 A

SUMMARY

Technical Problem

In the conventional technique described above, the drive circuit can, for example, supply current to the positive terminal of the capacitive load using a high-level drive signal, and supply current to the negative terminal using a low-level drive signal. However, when the high-level drive signal is supplied, current flows to the ground terminal of the inverting amplifier circuit on the negative side, which risks increasing the power consumption by that amount. Likewise, when the low-level drive signal is supplied, current flows to the ground terminal of the non-inverting amplifier circuit on the positive side, which risks increasing the power consumption by that amount. The drive circuit described above therefore has a problem in that current flows to the ground terminals during driving, which reduces the power efficiency and increases power consumption.

An object of the present technique is to provide a drive circuit, an electronic device, and a method of controlling a drive circuit that can reduce power consumption.

Solution to Problem

To achieve the above-described object, a drive circuit according to one aspect of the present technique includes: a first control circuit that controls application of an AC voltage to a first capacitive load; an inductive element that constitutes a first closed circuit together with the first capacitive load; a first diode-type element that is connected in series with the inductive element between the first capacitive load and the inductive element so as to constitute the first closed circuit; and a first switch element that is connected in series with the first diode-type element between the first capacitive load and the inductive element so as to constitute the first closed circuit.

Additionally, to achieve the above-described object, an electronic device according to one aspect of the present technique includes the drive circuit according to the above-described one aspect of the present technique.

Additionally, in this first side, each of the positive-side circuit and the negative-side circuit may include a chopper circuit that steps a voltage up and down. This provides an effect in that the voltage can be converted by the chopper circuit.

Additionally, to achieve the above-described object, a method of controlling a drive circuit according to one aspect of the present technique includes: in a first closed circuit constituted by an inductive element connected in series with a first capacitive load, a first diode-type element connected in series with the inductive element between the first capacitive load and the inductive element, and a first switch element connected in series with the first diode-type element between the first capacitive load and the inductive element, shifting the first switch element from an off state to an on state; inverting, via the first closed circuit, a polarity of a voltage applied to the first capacitive load; shifting the first switch element from the on state to the off state; and applying, from the first control circuit, an AC voltage of a same polarity as the voltage applied to the first capacitive load.

DESCRIPTION OF EMBODIMENTS

Embodiments for carrying out the present technique will be described hereinafter with reference to FIG. 1 to FIG. 11.

1. First Embodiment

Example of Configuration of Electronic Device

Figure 1:
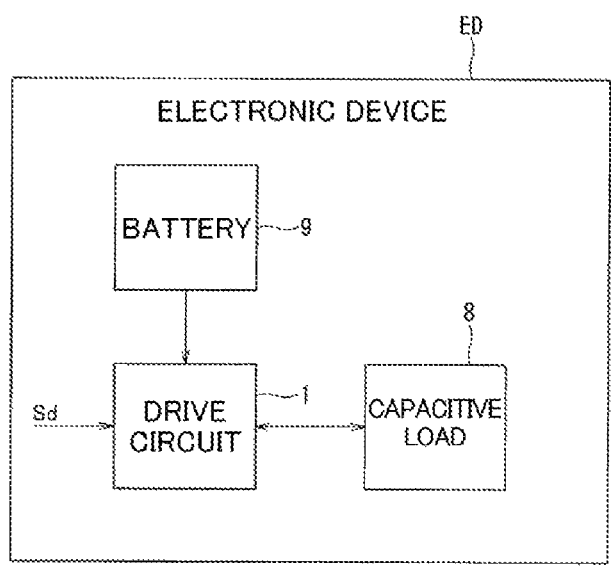
FIG. 1 is a block diagram illustrating an example of the configuration of an electronic device according to a first embodiment of the present technique.

First, an electronic device according to the present embodiment will be described with reference to FIG. 1. An electronic device ED according to the present embodiment includes a drive circuit 1 according to a first embodiment of the present technique. FIG. 1 is a block diagram illustrating an example of the configuration of the electronic device ED according to the first embodiment of the present technique. The electronic device ED includes a battery 9, the drive circuit 1 connected to the battery 9, and a capacitive load 8 connected to the drive circuit 1. For example, an image capturing device, a smartphone, or a robot is assumed as the electronic device ED.

As illustrated in FIG. 1, the battery 9 functions as a power source of the electronic device ED. The battery 9 is connected to the drive circuit 1 by a power supply cable. The battery 9 is a device that generates DC power and supplies the generated DC power to the drive circuit 1 over the power supply cable.

The drive circuit 1 is connected to the drive circuit 1 by a plurality of signal lines. The drive circuit 1 is a circuit that supplies electrical energy to the capacitive load 8 over a signal line and drives the capacitive load 8 according to a drive signal Sd input from the exterior. The capacitive load 8 includes, for example, a piezoelectric actuator (not shown). The piezoelectric actuator is an element that deforms and displaces a member such as a lens when supplied with electrical energy. The capacitive load 8 may include elements and circuits aside from the piezoelectric actuator.

Example of Configuration of Drive Circuit

Figure 2:
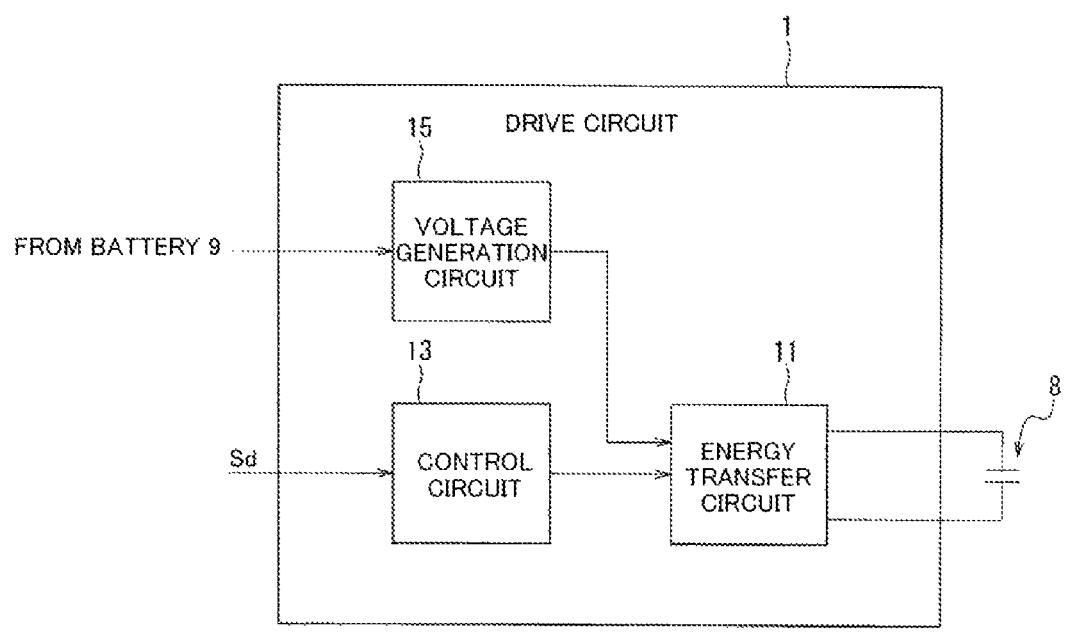
FIG. 2 is a block diagram illustrating an example of the configuration of a drive circuit according to the first embodiment of the present technique.

FIG. 2 is a block diagram illustrating an example of the configuration of the drive circuit 1 according to the first embodiment of the present technique. As illustrated in FIG. 2, the drive circuit 1 includes: a voltage generation circuit 15 connected to the battery 9 (not shown in FIG. 2); a control circuit 13 (an example of a first control circuit) to which the drive signal Sd is input; and an energy transfer circuit 11 connected to the voltage generation circuit 15 and the control circuit 13. The capacitive load 8 (an example of a first capacitive load) is connected to the energy transfer circuit 11.

The voltage generation circuit 15 boosts the DC voltage (e.g., 3.5 V) input from the battery 9 and outputs the boosted DC voltage (e.g., 5 V to 15 V) to the energy transfer circuit 11. The voltage generation circuit 15 is constituted by a direct current to direct current (DC-DC) voltage transform circuit that can change an output voltage within a predetermined range.

The control circuit 13 is a circuit that controls the application of AC voltage to the capacitive load 8. The control circuit 13 generates a control signal that controls the energy transfer circuit 11 on the basis of the drive signal Sd input from the exterior. The control circuit 13 will be described in detail later.

The energy transfer circuit 11 is a circuit that transfers energy stored in the capacitive load 8 to an inductive element (described in detail later) when the capacitive load 8 is driven. The drive circuit 1 drives the capacitive load 8 by supplying power from the voltage generation circuit 15. Although details will be given later, when driving the capacitive load 8, the drive circuit 1 can supply power from the voltage generation circuit 15 while charging and discharging the capacitive load 8 using the energy transfer circuit 11. This makes it possible for the drive circuit 1 to achieve low power consumption.

Figure 3:
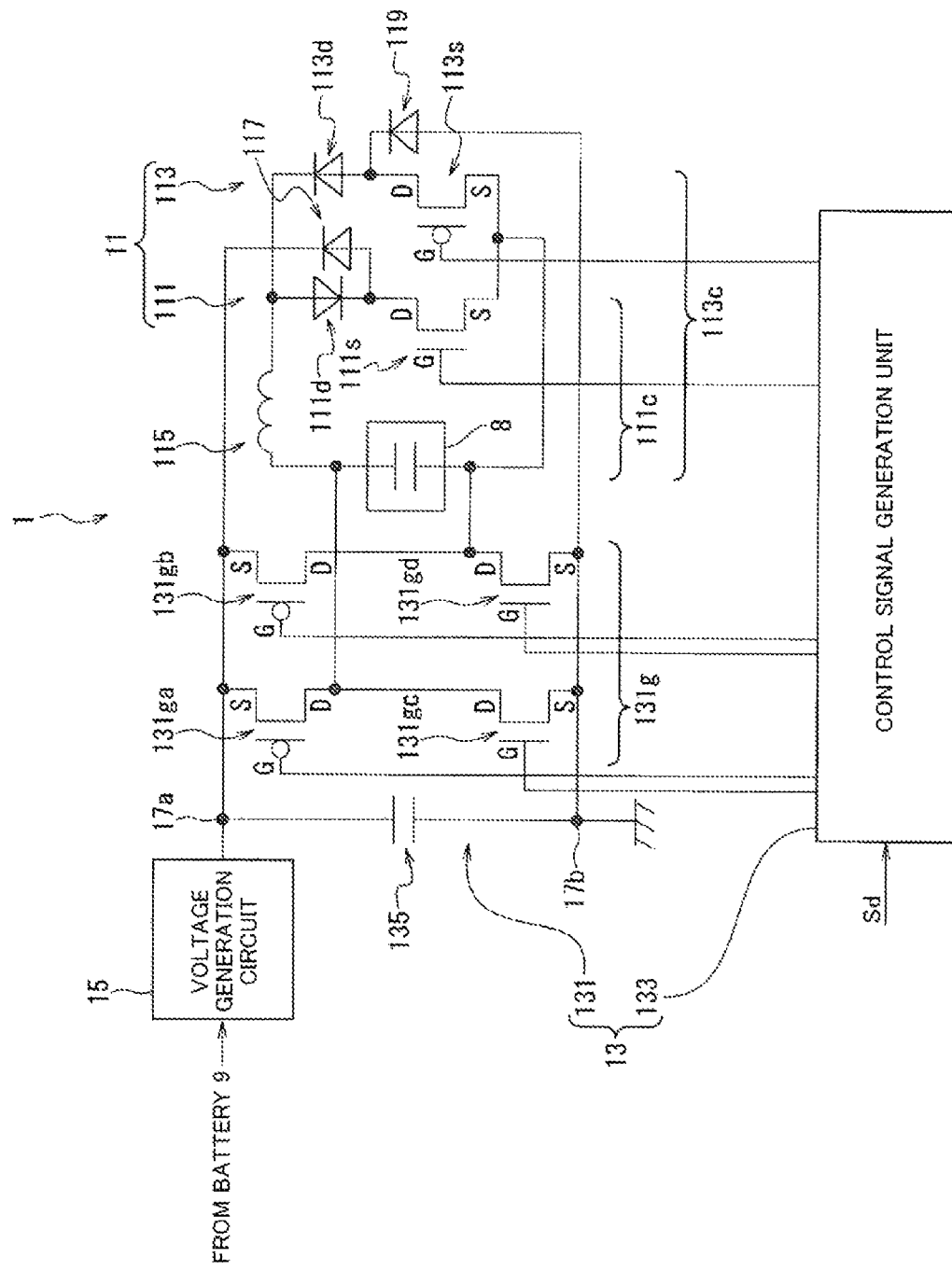
FIG. 3 is a circuit diagram illustrating an example of the configuration of the drive circuit according to the first embodiment of the present technique.

The specific circuit configuration of the drive circuit 1 according to the present embodiment will be described next with reference to FIG. 3. FIG. 3 is a circuit diagram illustrating an example of the configuration of the drive circuit 1.

As illustrated in FIG. 3, the drive circuit 1 includes the control circuit 13, which controls the application of AC voltage to the capacitive load 8. The drive circuit 1 includes an inductive element 115 that constitutes a closed circuit 111c (an example of a first closed circuit) together with the capacitive load 8. The drive circuit 1 includes a diode 111d (an example of a first diode-type element) which is connected in series with the inductive element 115 between the capacitive load 8 and the inductive element 115 so as to constitute the closed circuit 111c. The diode 111d is constituted by a PN junction diode, for example. The drive circuit 1 includes a switch element 111s (an example of a first switch element) which is connected in series with the diode 111d between the capacitive load 8 and the inductive element 115 so as to constitute a closed circuit 115c. The switch element 111s is constituted by an N-type field effect transistor, for example.

More specifically, one terminal of the inductive element 115 is connected to one terminal of the capacitive load 8. The other terminal of the inductive element 115 is connected to an anode terminal of the diode 111d. A cathode terminal of the diode 111d is connected to a drain terminal D of the switch element 111s. A source terminal S of the switch element 111s is connected to the other terminal of the capacitive load 8. As a result, a current path for current flow is established by the capacitive load 8, the inductive element 115, the diode 111d, and the switch element 111s, which configures the closed circuit 111c. In the present embodiment and the second to fourth embodiments described below, a circuit in which a current path is established for current flow when a switch element or the like is in a closed state is defined as a closed circuit, even if the current path may be electrically disconnected when the stated switch element is in an off state.

As illustrated in FIG. 3, the drive circuit 1 includes a diode 113d (an example of a second diode-type element) which is connected in series with the inductive element 115 and in parallel with the diode 111d and the switch element 111s so as to constitute a closed circuit 113c (an example of a second closed circuit). The diode 113d is constituted by a PN junction diode, for example. The drive circuit 1 includes a switch element 113s (an example of a second switch element) which is connected in series with the diode 113d and in parallel with the diode 111d and the switch element 111s so as to constitute the closed circuit 113c. The switch element 113s is constituted by a P-type field effect transistor, for example.

More specifically, a cathode terminal of the diode 113d is connected to the other terminal of the inductive element 115 and the anode terminal of the diode 111d. An anode terminal of the diode 113d is connected to a drain terminal D of the switch element 113s. A source terminal S of the switch element 113s is connected to the source terminal S of the switch element 111s and the other terminal of the capacitive load 8. As a result, a current path for current flow is established by the capacitive load 8, the switch element 113s, the diode 113d, and the inductive element 115, which configures the closed circuit 113c.

As illustrated in FIG. 3, the control circuit 13 provided in the drive circuit 1 includes a bridge circuit 131 (an example of a first bridge circuit) which is constituted by a switch element group 131g (an example of a first switch element group) having a plurality of (four, in the present embodiment) switch elements 131ga to 131gd and which is connected to both ends of the capacitive load 8. The control circuit 13 also includes a control signal generation unit 133 (a first control signal generation unit) that generates control signals which control the switching of the plurality of switch elements 131ga to 131gd, the switch element 111s, and the switch element 113s.

The bridge circuit 131 is connected between a supply end 17a (an example of a first supply end) for a positive-side DC potential (an example of a first DC potential) and a supply end 17b (an example of a second supply end) for a reference DC potential (an example of a second DC potential). The positive-side DC potential is a high level-side potential of the voltage generated by the voltage generation circuit 15. The supply end 17b for the reference DC potential is a ground terminal. A reference potential terminal of the voltage generation circuit 15 is connected to this ground terminal. The voltage generated by the voltage generation circuit 15 corresponds to a potential difference between the positive-side DC potential and the reference DC potential. Accordingly, the voltage generated by the voltage generation circuit 15 is applied to both ends of the bridge circuit 131.

The control circuit 13 includes a capacitor 135 provided between the supply end 17a and the supply end 17b. One electrode of the capacitor 135 is connected to the supply end 17a, and another electrode of the capacitor 135 is connected to the supply end 17b. The capacitor 135 is provided in order to prevent fluctuations in the voltage output from the voltage generation circuit 15. Accordingly, an almost constant voltage is supplied to both ends of the bridge circuit 131.

The bridge circuit 131 has a full bridge circuit configuration, constituted by the four switch elements 131ga to 131gd. The switch element 131ga and the switch element 131gb are constituted by P-type field effect transistors, for example. The switch element 131gc and the switch element 131gd are constituted by N-type field effect transistors, for example.

A source terminal S of the switch element 131ga is connected to the supply end 17a and a source terminal S of the switch element 131gb. A drain terminal D of the switch element 131ga is connected to a drain terminal D of the switch element 131gc. A drain terminal D of the switch element 131gb is connected to a drain terminal D of the switch element 131gd. A source terminal S of the switch element 131gc and a source terminal S of the switch element 131gd are connected to the supply end 17b.

The drain terminal D of the switch element 131ga and the drain terminal D of the switch element 131gc are connected to the one terminal of the capacitive load 8 and the one terminal of the inductive element 115. The drain terminal D of the switch element 131gb and the drain terminal D of the switch element 131gd are connected to the other terminal of the capacitive load 8, as well as to the source terminal S of the switch element 111s and the source terminal S of the switch element 113s.

Accordingly, when the switch element 131ga and the switch element 131gd are in an on state, and the switch element 131gb and the switch element 131gc are in an off state, the one terminal of the capacitive load 8 is electrically connected to the supply end 17a by the switch element 131ga, and the other terminal of the capacitive load 8 is connected to the supply end 17b by the switch element 131gd. Accordingly, when the switch elements 131ga and 131gd are in an on state and the switch elements 131gb and 131gc are in an off state, the positive-side DC potential is applied to the one terminal of the capacitive load 8, and a negative-side DC potential is applied to the other terminal of the capacitive load 8. In the present embodiment and the second to fourth embodiments described below, the DC voltage applied to the capacitive load is assumed to be positive when the one terminal is higher than the other terminal and negative when the other terminal is higher than the one terminal. As a result, the DC voltage applied to both ends of the capacitive load 8 is a positive voltage.

Additionally, when the switch element 131ga and the switch element 131gd are in an off state, and the switch element 131gb and the switch element 131gc are in an on state, the one terminal of the capacitive load 8 is electrically connected to the supply end 17b by the switch element 131gc, and the other terminal of the capacitive load 8 is connected to the supply end 17a by the switch element 131gb. Accordingly, when the switch elements 131ga and 131gd are in an off state and the switch elements 131gb and 131gc are in an on state, the negative-side DC potential is applied to the one terminal of the capacitive load 8, and the positive-side DC potential is applied to the other terminal of the capacitive load 8. As a result, the DC voltage applied to both ends of the capacitive load 8 is a negative voltage.

The control signal generation unit 133 includes a plurality of (six, in the present embodiment) output terminals that output a plurality of control signals generated on the basis of the drive signal Sd input from the exterior. Four terminals of the plurality of output terminals in the control signal generation unit 133 are connected one-to-one to gate terminals G of respective ones of the four switch elements 131ga to 131gd. Accordingly, the control circuit 13 can control the on/off states of the four switch elements 131ga to 131gd independently, and can apply an AC voltage in which the polarity of the DC voltage inverts to both ends of the capacitive load 8.

As illustrated in FIG. 3, the drive circuit 1 includes an energy transfer unit 111 (an example of a first energy transfer unit) which is constituted by the inductive element 115, the diode 111d, and the switch element 111s, and which transfers energy stored in the capacitive load 8. The drive circuit 1 includes an energy transfer unit 113 (an example of a second energy transfer unit) which is constituted by the inductive element 115, the diode 113d, and the switch element 113s, and which transfers energy stored in the capacitive load 8. The drive circuit 1 includes the energy transfer circuit 11, which in turn includes the energy transfer unit 111 and the energy transfer unit 113.

The energy transfer unit 111 includes the diode 111d, for which the forward direction is the direction from the one terminal of the capacitive load 8 toward the other terminal of the capacitive load 8. The energy transfer unit 113 includes the diode 113d, for which the forward direction is the direction from the other terminal of the capacitive load 8 toward the one terminal of the capacitive load 8. The remaining (two) terminals of the plurality of output terminals that output the control signals in the control signal generation unit 133 are connected one-to-one to gate terminals G of the switch element 111s and the switch element 113s, respectively. Accordingly, the control circuit 13 can control the on/off states of the switch element 111s and the switch element 113s independently.

Accordingly, when energy based on the positive DC voltage is stored in the capacitive load 8, the energy transfer circuit 11 is controlled by the control circuit 13 to put the switch element 111s in an on state and the switch element 113s in an off state. As a result, a current path is established in the closed circuit 111c, and thus the energy stored in the capacitive load 8 is transferred to the inductive element 115 by the closed circuit 111c, and the DC voltage applied to both ends of the capacitive load 8 is stepped down.

On the other hand, when energy based on the negative DC voltage is stored in the capacitive load 8, the energy transfer circuit 11 is controlled by the control circuit 13 to put the switch element 111s in an off state and the switch element 113s in an on state. As a result, a current path is established in the closed circuit 113c, and thus the energy stored in the capacitive load 8 is transferred to the inductive element 115 by the closed circuit 113c, and the DC voltage applied to both ends of the capacitive load 8 is stepped up.

As illustrated in FIG. 3, the drive circuit 1 includes a reverse bias diode 117 (an example of a first reverse bias diode-type element) connected between a point between the capacitive load 8 and the inductive element 115, and the supply end 17a (an example of a first supply end) for the positive-side DC potential (an example of a first DC potential). The reverse bias diode 117 is constituted by a PN junction diode, for example. A cathode terminal of the reverse bias diode 117 is connected to the supply end 17a from which the positive-side DC potential is output. An anode terminal of the reverse bias diode 117 is connected to the cathode terminal of the diode 111d and the drain terminal D of the switch element 111s. The positive-side DC potential is a high level-side potential of the voltage generated by the voltage generation circuit 15. The supply end 17a is a terminal for supplying a voltage generated by the voltage generation circuit 15 through the control circuit 13 to the capacitive load 8. Accordingly, a reverse bias is applied to the reverse bias diode 117 by the positive-side DC potential.

The drive circuit 1 includes a reverse bias diode 119 (an example of a second reverse bias diode-type element) connected between a point between the capacitive load 8 and the inductive element 115, and the supply end 17b (an example of a second supply end) for the reference DC potential (an example of a second DC potential). The reverse bias diode 119 is constituted by a PN junction diode, for example. An anode terminal of the reverse bias diode 119 is connected to the supply end 17b from which the reference current potential is output. A cathode terminal of the reverse bias diode 119 is connected to the anode terminal of the diode 113d and the drain terminal D of the switch element 113s. The supply end 17b for the reference current potential is a ground terminal. Accordingly, a reverse bias is applied to the reverse bias diode 119 by the reference DC potential.

Incidentally, the closed circuit 111c and the closed circuit 113c are not directly connected to the supply end 17a and the supply end 17b. As such, the drive circuit 1 does not have a path through which current flows from the capacitive load 8 to the voltage generation circuit 15, the supply end 17b (ground terminal) for the reference current potential, and so on. Accordingly, when the drive circuit 1 transfers energy from the capacitive load 8 to the energy transfer circuit 11, the energy stored in the capacitive load 8 is prevented from being discharged to the voltage generation circuit 15, the ground terminal, and so on. Thus when the drive circuit 1 drives the capacitive load 8, transfer loss in the transfer of energy from the capacitive load 8 to the energy transfer circuit 11 can be reduced. The drive circuit 1 can therefore reduce power consumption when driving the capacitive load 8.

However, because the closed circuits 111c and 113c are not directly connected to constant voltage parts such as the output terminal of the voltage generation circuit 15 and ground terminals, the voltage across both terminals of the capacitive load 8 may deviate from the potential difference between the supply end 17a and the supply end 17b as the capacitive load 8 repeatedly charges and discharges. However, as described above, the drive circuit 1 includes the reverse bias diode 117 and the reverse bias diode 119, which are connected to the energy transfer circuit 11. Accordingly, a point between the terminals of the capacitive load 8 and the inductive element 115 that are not connected to each other in the closed circuit 111c (i.e., a point between the other terminals of the capacitive load 8 and the inductive element 115) is electrically connected to the output terminal of the voltage generation circuit 15 by the reverse bias diode 117 and the supply end 17a. Likewise, a point between the terminals of the capacitive load 8 and the inductive element 115 that are not connected to each other in the closed circuit 113c (i.e., a point between the other terminals of the capacitive load 8 and the inductive element 115) is electrically connected to the supply unit for the reference current potential (the ground terminal) by the reverse bias diode 119 and the supply end 17b. Thus in the drive circuit 1, the voltage across both terminals of the capacitive load 8 is prevented from deviating from the potential difference between the supply end 17a and the supply end 17b, even when the capacitive load 8 repeatedly charges and discharges.

Method of Controlling Drive Circuit

Figure 4:
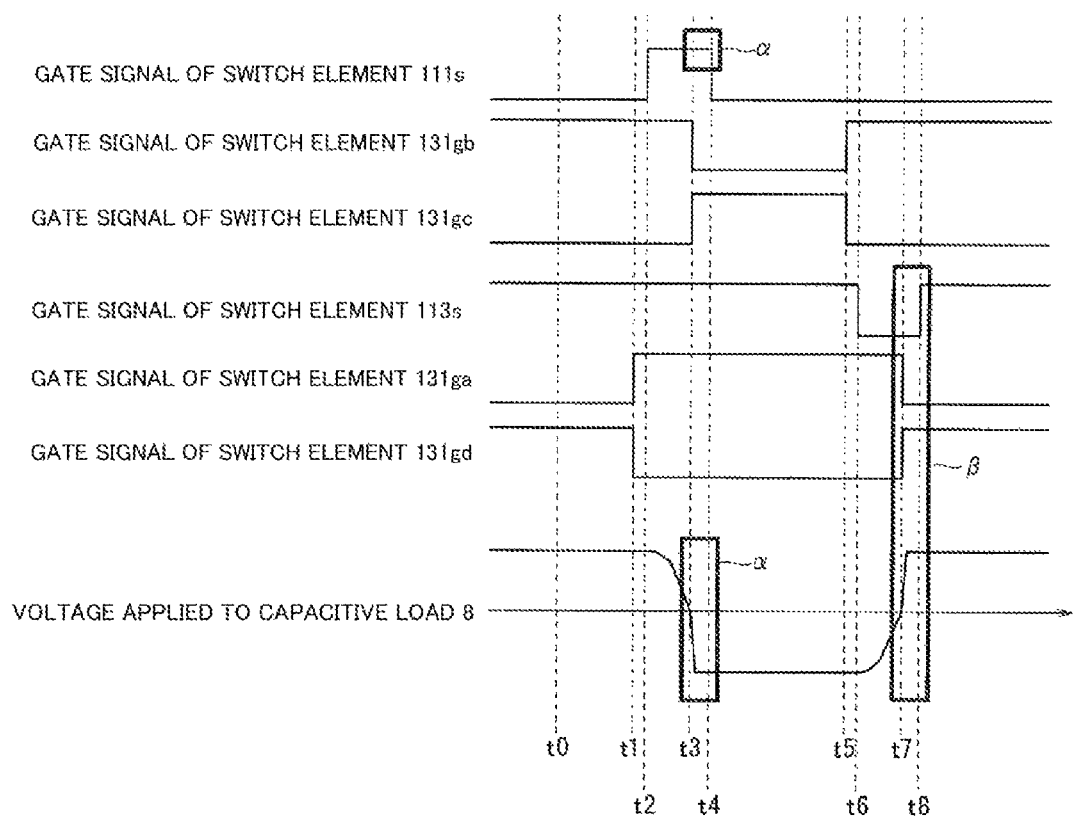
FIG. 4 is a diagram (No. 1) illustrating an example of a control waveform for illustrating a method of controlling the drive circuit according to the first embodiment of the present technique.
Figure 5:
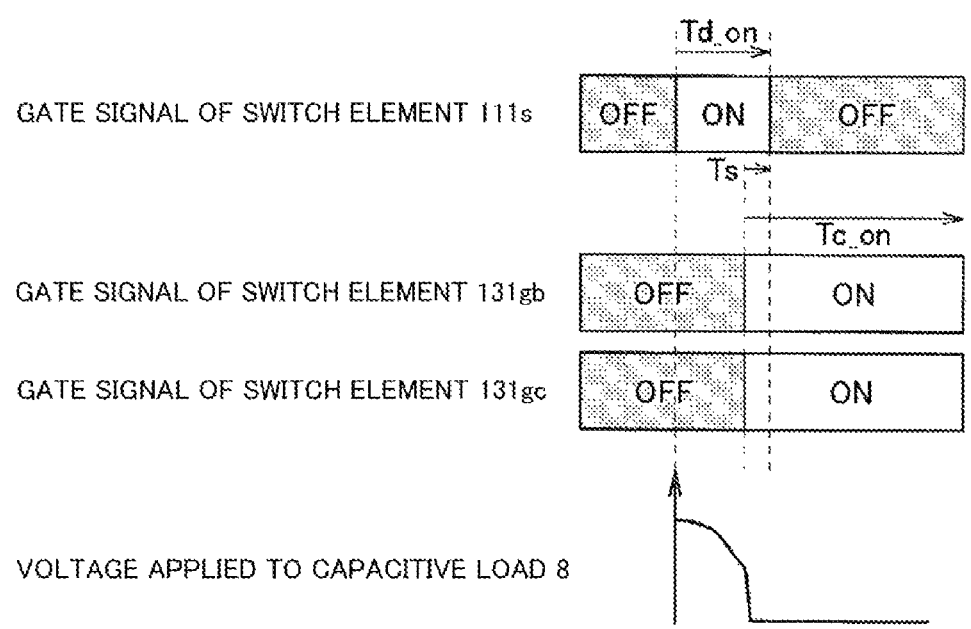
FIG. 5 is a diagram (No. 2) illustrating an example of a control waveform for illustrating a method of controlling the drive circuit according to the first embodiment of the present technique.

A method of driving the drive circuit according to the present embodiment will be described with reference to FIG. 4 and FIG. 5, while also referring to FIG. 3. FIG. 4 is a diagram illustrating an example of a control waveform for illustrating a method of controlling the drive circuit 1 according to the present embodiment. The first line in FIG. 4 indicates a voltage waveform of a gate signal (control signal) applied to the gate terminal G of the switch element 111s, and the second line in FIG. 4 indicates a voltage waveform of a gate signal (control signal) applied to the gate terminal G of the switch element 131gb. The third line in FIG. 4 indicates a voltage waveform of a gate signal (control signal) applied to the gate terminal G of the switch element 131gc, and the fourth line in FIG. 4 indicates a voltage waveform of a gate signal (control signal) applied to the gate terminal G of the switch element 113s. The fifth line in FIG. 4 indicates a voltage waveform of a gate signal (control signal) applied to the gate terminal G of the switch element 131ga, and the second line in FIG. 4 indicates a voltage waveform of a gate signal (control signal) applied to the gate terminal G of the switch element 131*gd*. In FIG. 4, the passage of time is represented by progress from the left to the right. FIG. 5 illustrates the state of each switch element based on the voltage waveforms in the area enclosed in a square frame α in FIG. 4 and the areas before and after the square frame α.

As illustrated in FIG. 4, at time t0, the voltage levels of the gate signals of the switch elements 131*gb* and 131*gd* of the bridge circuit 131 are at high level, and the voltage levels of the gate signals of the switch elements 131*ga* and 131*gc* of the bridge circuit 131 are at low level. As such, the switch elements 131*ga* and 131*gd* of the bridge circuit 131 are in an on state, and the switch elements 131*gb* and 131*gc* are in an off state. Additionally, the voltage level of the gate signal of the switch element 111*s* of the energy transfer circuit 11 is at low level, and the voltage level of the gate signal of the switch element 113*s* of the energy transfer circuit 11 is at high level. As such, both the switch element 111*s* and the switch element 113*s* of the energy transfer circuit 11 are in an off state. A positive voltage is therefore applied to the capacitive load 8.

At time t1 after time t0, the voltage level of the gate signal of the switch element 131*ga* shifts from low level to high level, and the voltage level of the gate signal of the switch element 131*gd* shifts from high level to low level. At time t1, the voltage levels of the gate signals of the other switch elements 131*gb*, 131*gc*, 111*s*, and 113*s* do not change. The switch elements 131*ga* and 131*gd* shift from an off state to an on state as a result. On the other hand, the switch elements 131*gb* and 131*gc* remain in an off state. The positive voltage therefore remains applied to the capacitive load 8.

At time t2 after time t1, the voltage level of the gate signal of the switch element 111*s* shifts from low level to high level, but the voltage levels of the gate signals of the other switch elements 131*ga* to 131*gd* and 113*s* do not change. Accordingly, the switch element 111*s* shifts from an off state to an on state, and the current path of the closed circuit 111*c* is established. On the other hand, the switch element 113*s* remains in an off state, and thus the current path of the closed circuit 113*c* is not established. Furthermore, the switch elements 131*ga* to 131*gd* remain in an off state, and thus the capacitive load 8 remains electrically disconnected from the supply ends 17*a* and 17*a*. As a result, at time t2, the transfer of energy from the capacitive load 8 to the inductive element 115 of the energy transfer circuit 11 begins, and the voltage applied to the capacitive load 8 begins to drop.

At time t3 after time t2, the voltage level of the gate signal of the switch element 131*gb* shifts from high level to low level, and the voltage level of the gate signal of the switch element 131*gc* shifts from low level to high level. At time t3, the voltage levels of the gate signals of the other switch elements 131*ga*, 131*gd*, 111*s*, and 113*s* do not change. The switch elements 131*gb* and 131*gc* shift from an off state to an on state as a result. On the other hand, the switch elements 131*ga* and 131*gd* remain in an off state. Accordingly, the one terminal of the capacitive load 8 is connected to the supply end 17*b* by the switch element 131*gc*, and the other terminal of the capacitive load 8 is connected to the supply end 17*a* by the switch element 131*gb*. As a result, a negative voltage is applied to the capacitive load 8 by the voltage output from the voltage generation circuit 15, and the voltage applied to the capacitive load 8 drops further. In this manner, the drive circuit 1 can drive the capacitive load 8 without producing a reverse flow of energy during the transfer, even if the output voltage of the voltage generation circuit 15 is applied to the capacitive load 8 while the energy is being transferred from the capacitive load 8 to the energy transfer circuit 11 and the voltage applied to the capacitive load 8 is dropping.

At time t4 after time t3, the voltage level of the gate signal of the switch element 111*s* shifts from high level to low level, but the voltage levels of the gate signals of the other switch elements 131*ga* to 131*gd* and 113*s* do not change. Accordingly, the switch element 111*s* shifts from an on state to an off state, and the current path of the closed circuit 111*c* is cut off. On the other hand, the switch element 113*s* remains in an off state, and thus the current path of the closed circuit 113*c* is not established. Furthermore, the switch elements 131*gb* and 131*gc* remain in an on state. Accordingly, the reference DC potential is applied to the one terminal of the capacitive load 8, and the positive-side DC potential is applied to the other terminal of the capacitive load 8. As a result, a negative voltage of the same magnitude as the output voltage of the voltage generation circuit 15 remains applied across both terminals of the capacitive load 8.

At time t5 after time t4, the voltage level of the gate signal of the switch element 131*gb* shifts from low level to high level, and the voltage level of the gate signal of the switch element 131*gc* shifts from high level to low level. At time t5, the voltage levels of the gate signals of the other switch elements 131*ga*, 131*gd*, 111*s*, and 113*s* do not change. The switch elements 131*gb* and 131*gc* shift from an on state to an off state as a result. On the other hand, the switch elements 131*ga* and 131*gd* remain in an off state. Accordingly, the capacitive load 8 is electrically disconnected from the supply ends 17*a* and 17*b*, but a negative voltage having the same magnitude as the output voltage of the voltage generation circuit 15 remains applied to the capacitive load 8.

At time t6 after time t5, the voltage level of the gate signal of the switch element 113*s* shifts from high level to low level, but the voltage levels of the gate signals of the other switch elements 131*ga* to 131*gd* and 111*s* do not change. Accordingly, the switch element 113*s* shifts from an off state to an on state, and the current path of the closed circuit 113*c* is established. On the other hand, the switch element 111*s* remains in an off state, and thus the current path of the closed circuit 111*c* is not established. Furthermore, the switch elements 131*ga* to 131*gd* remain in an off state, and thus the capacitive load 8 remains electrically disconnected from the supply ends 17*a* and 17*a*. As a result, at time t6, the transfer of energy from the capacitive load 8 to the inductive element 115 of the energy transfer circuit 11 begins, and the voltage applied to the capacitive load 8 begins to rise.

At time t7 after time t6, the voltage level of the gate signal of the switch element 131*ga* shifts from high level to low level, and the voltage level of the gate signal of the switch element 131*gd* shifts from low level to high level. At time t7, the voltage levels of the gate signals of the other switch elements 131*gb*, 131*gc*, 111*s*, and 113*s* do not change. The switch elements 131*ga* and 131*gd* shift from an off state to an on state as a result. On the other hand, the switch elements 131*gb* and 131*gc* remain in an off state. Accordingly, the one terminal of the capacitive load 8 is connected to the supply end 17*a* by the switch element 131*ga*, and the other terminal of the capacitive load 8 is connected to the supply end 17*b* by the switch element 131*gd*. As a result, a positive voltage is applied to the capacitive load 8 by the voltage output from the voltage generation circuit 15, and the voltage applied to the capacitive load 8 rises further. In this manner, the drive circuit 1 can drive the capacitive load 8 without producing a reverse flow of energy during the transfer, even if the output voltage of the voltage generation circuit 15 is applied to the capacitive load 8 while the energy is being transferred from the capacitive load 8 to the energy transfer circuit 11 and the voltage applied to the capacitive load 8 is rising.

At time t8 after time t7, the voltage level of the gate signal of the switch element 113s shifts from low level to high level, but the voltage levels of the gate signals of the other switch elements 131ga to 131gd and 111s do not change. Accordingly, the switch element 113s shifts from an on state to an off state, and the current path of the closed circuit 113c is cut off. On the other hand, the switch element 111s remains in an off state, and thus the current path of the closed circuit 111c is not established. Furthermore, the switch elements 131ga and 131gd remain in an on state. Accordingly, the positive-side DC potential is applied to the one terminal of the capacitive load 8, and the reference DC potential is applied to the other terminal of the capacitive load 8. As a result, a positive voltage of the same magnitude as the output voltage of the voltage generation circuit 15 remains applied across both terminals of the capacitive load 8. The drive circuit 1 drives the capacitive load 8 while inverting the polarity of the voltage applied to the capacitive load 8 by repeating the operations from time t0 to time t8.

As illustrated in FIG. 5, a period when the switch element 111s of the energy transfer circuit 11 is in an on state is an energy discharge operation period Td_on. A period when the switch element 131gb and the switch element 131gc of the bridge circuit 131 are in an on state is a driving operation period Tc_on of the capacitive load 8. As described above, the drive circuit 1 can begin driving the capacitive load 8 while energy is being transferred from the capacitive load 8 to the energy transfer circuit 11 (while the energy is being discharged). In the present embodiment, it is not necessary to precisely control a simultaneous operation period Ts in which the energy discharge operation period Td_on and the driving operation period Tc_on of the capacitive load 8 operate simultaneously. If the driving operation period Tc_on of the capacitive load 8 starts during the energy discharge operation period Td_on, the drive circuit 1 can quickly invert the voltage applied to the capacitive load 8 with a low amount of power. The length of the simultaneous operation period Ts contributes almost nothing to reducing the power and increasing the speed of the drive circuit 1. In this manner, the method of controlling the drive circuit according to the present embodiment can increase the tolerance of timing error between the discharge timing and drive timing of the capacitive load.

As indicated by a rectangular frame β in FIG. 4, during an energy charge operation period of the capacitive load 8, if, like the energy discharge operation period Td_on of the capacitive load 8 indicated in FIG. 5, the drive operation period of the capacitive load 8 is started during the energy charge operation period, the voltage applied to the capacitive load 8 can be inverted quickly with a low amount of power.

As described thus far, with the method of controlling the drive circuit 1 according to the present embodiment, the switch element 111s of the closed circuit 111c (see FIG. 3), which is constituted by the inductive element 115 connected in series to the capacitive load 8, the diode 111d connected in series to the inductive element 115 between the capacitive load 8 and the inductive element 115, and the switch element 111s connected in series to the diode 111d between the capacitive load 8 and the inductive element 115, shifts from an off state to an on state (see time t2 indicated in FIG. 4). Then, in the method of controlling the drive circuit 1, the polarity of the voltage applied to the capacitive load 8 is inverted via the closed circuit 111c (see time t3 indicated in FIG. 4). Then, in the method of controlling the drive circuit 1, the switch element 111s shifts from an on state to an off state (see time t4 indicated in FIG. 4), and an AC voltage having the same polarity as the voltage applied to the capacitive load 8 is applied from the control circuit 13 (time t4 to time t5 indicated in FIG. 4).

In the method of controlling the drive circuit 1, after the AC voltage having the same polarity as the voltage applied to the capacitive load 8 has been applied to the capacitive load 8 from the control circuit 13 (time t5 indicated in FIG. 4), the switch element 113s, of the diode 113d and the switch element 113s (see FIG. 3) which are connected in series to the inductive element 115, connected in parallel to the diode 111d and the switch element 111s, constitute the closed circuit 113c, and are connected to each other in series, shifts from an off state to an on state (time t6 indicated in FIG. 4). Then, in the method of controlling the drive circuit 1, the polarity of the voltage applied to the capacitive load 8 through the closed circuit 113c is inverted (see time t7 indicated in FIG. 4). Then, in the method of controlling the drive circuit 1, the switch element 113s shifts from an on state to an off state (see time t8 indicated in FIG. 4), and an AC voltage having the same polarity as the voltage applied to the capacitive load 8 is applied from the control circuit 13 (time t8 and on indicated in FIG. 4).

As described thus far, the drive circuit 1 according to the present embodiment includes the control circuit 13, which controls the application of AC voltage to the capacitive load 8. The drive circuit 1 includes: the inductive element 115, which constitutes the closed circuit 111c along with the capacitive load 8; the diode 111d, which is connected in series to the inductive element 115 between the capacitive load 8 and the inductive element 115 so as to constitute the closed circuit 111c; and the switch element 111s, which is connected in series to the diode 111d between the capacitive load 8 and the inductive element 115 so as to constitute the closed circuit 111c.

The drive circuit 1 having this configuration can drive the capacitive load 8 (invert the applied voltage) during the transfer of energy from the capacitive load 8 to the energy transfer circuit 11. This makes it possible for the drive circuit 1 to reduce the power consumption. The electronic device ED including the drive circuit 1 can also reduce the power consumption.

2. Second Embodiment

A drive circuit, an electronic device, and a method of controlling a drive circuit according to a second embodiment of the present technique will be described with reference to FIG. 6. The electronic device according to the present embodiment has the same configuration and provides the same functions as the electronic device ED according to the foregoing first embodiment, and will therefore not be described. Additionally, the drive circuit according to the present embodiment has the same exemplary configuration as the drive circuit 1 according to the foregoing first embodiment, and thus a block diagram thereof will not be provided. Furthermore, with respect to constituent elements of the drive circuit according to the present embodiment, constituent elements that perform the same actions and functions as the drive circuit according to the foregoing first embodiment will be given the same reference signs, and will not be described.

[Example of Configuration of Drive Circuit]

Figure 6:
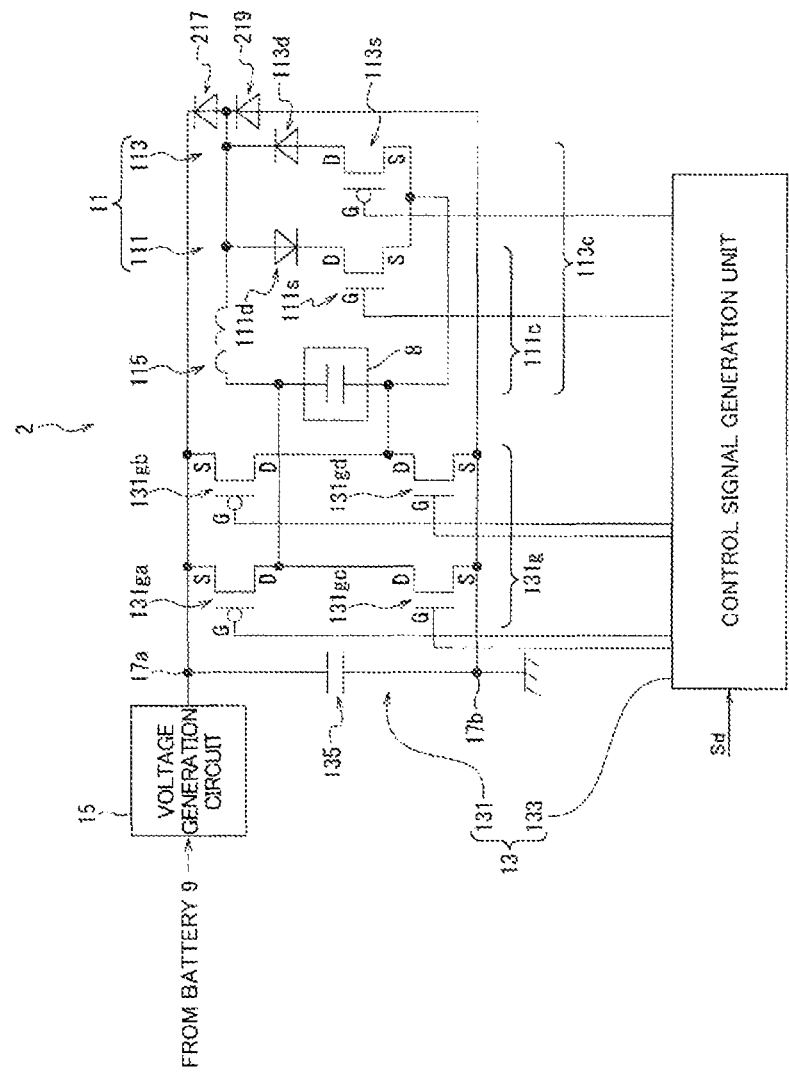
FIG. 6 is a circuit diagram illustrating an example of the configuration of a drive circuit according to a second embodiment of the present technique.

FIG. 6 is a circuit diagram illustrating an example of the configuration of a drive circuit 2 according to the present embodiment. The drive circuit 2 has a feature in that the connections of the reverse bias diodes are different from those in the drive circuit 1.

As illustrated in FIG. 6, the drive circuit 2 includes the energy transfer circuit 11 and the control circuit 13, which have the same configurations as in the drive circuit 1 according to the foregoing first embodiment. A reverse bias diode 217 (an example of a first reverse bias diode-type element) is connected between a point between the capacitive load 8 and the inductive element 115, and the supply end 17a for the positive-side DC potential, and a reverse bias is applied by the positive-side DC potential. A reverse bias diode 219 (an example of a second reverse bias diode-type element) is connected between a point between the capacitive load 8 and the inductive element 115, and the supply end 17b for the reference current potential, and a reverse bias is applied by the reference DC potential. The reverse bias diodes 217 and 219 are constituted by PN junction diodes, for example.

A cathode terminal of the reverse bias diode 217 is connected to the supply end 17a, the source terminal S of the switch element 131ga, and the source terminal of the switch element 131gb. An anode terminal of the reverse bias diode 217 is connected to the other terminal of the inductive element 115, the anode terminal of the diode 111d, the cathode terminal of the diode 113d, and a cathode terminal of the reverse bias diode 219. An anode terminal of the reverse bias diode 219 is connected to the supply end 17b, the source terminal S of the switch element 131gc, and the source terminal of the switch element 131gd.

The closed circuit 111c and the closed circuit 113c according to the present embodiment are not directly connected to the supply end 17a and the supply end 17b, as in the foregoing first embodiment. Thus when the drive circuit 2 drives the capacitive load 8, transfer loss in the transfer of energy from the capacitive load 8 to the energy transfer circuit 11 can be reduced. The drive circuit 1 can therefore reduce power consumption when driving the capacitive load 8.

Additionally, because the closed circuits 111c and 113c are not directly connected to constant voltage parts such as the output terminal of the voltage generation circuit 15 and ground terminals, the voltage across both terminals of the capacitive load 8 may deviate from the potential difference between the supply end 17a and the supply end 17b, in the same manner as in the foregoing first embodiment. However, the drive circuit 2 includes the reverse bias diode 217 and the reverse bias diode 219, which are connected to the energy transfer circuit 11. Accordingly, in both the closed circuit 111c and the closed circuit 113c, a point between the terminals of the capacitive load 8 and the inductive element 115 that are not connected to each other (i.e., a point between the other terminals of the capacitive load 8 and the inductive element 115) is electrically connected to the output terminal of the voltage generation circuit 15 by the reverse bias diode 217 and the supply end 17a. Furthermore, in both the closed circuit 111c and the closed circuit 113c, a point between the terminals of the capacitive load 8 and the inductive element 115 that are not connected to each other (i.e., a point between the other terminals of the capacitive load 8 and the inductive element 115) is electrically connected to the supply unit for the reference current potential (the ground terminal) by the reverse bias diode 119 and the supply end 17b. Thus in the drive circuit 2, the voltage across both terminals of the capacitive load 8 is prevented from deviating from the potential difference between the supply end 17a and the supply end 17b, even when the capacitive load 8 repeatedly charges and discharges.

Method of Controlling Drive Circuit

The drive circuit 2 includes the bridge circuit 131 and the energy transfer circuit 11, which have the same configurations as in the drive circuit 1 according to the foregoing first embodiment. Accordingly, the method of controlling the drive circuit 2 is the same as the method of controlling the drive circuit 1 according to the foregoing first embodiment and will therefore not be described.

As described thus far, the drive circuit according to the present embodiment can provide the same effects as the drive circuit, the electronic device, and the method of controlling a drive circuit according to the foregoing first embodiment.

3. Third Embodiment

A drive circuit, an electronic device, and a method of controlling a drive circuit according to a third embodiment of the present technique will be described with reference to FIG. 7. The electronic device according to the present embodiment has the same configuration and provides the same functions as the electronic device ED according to the foregoing first embodiment, and will therefore not be described. Additionally, the drive circuit according to the present embodiment has the same exemplary configuration as the drive circuit 1 according to the foregoing first embodiment, and thus a block diagram thereof will not be provided. Furthermore, with respect to constituent elements of the drive circuit according to the present embodiment, constituent elements that perform the same actions and functions as the drive circuit according to the foregoing first embodiment will be given the same reference signs, and will not be described.

[Example of Configuration of Drive Circuit]

Figure 7:
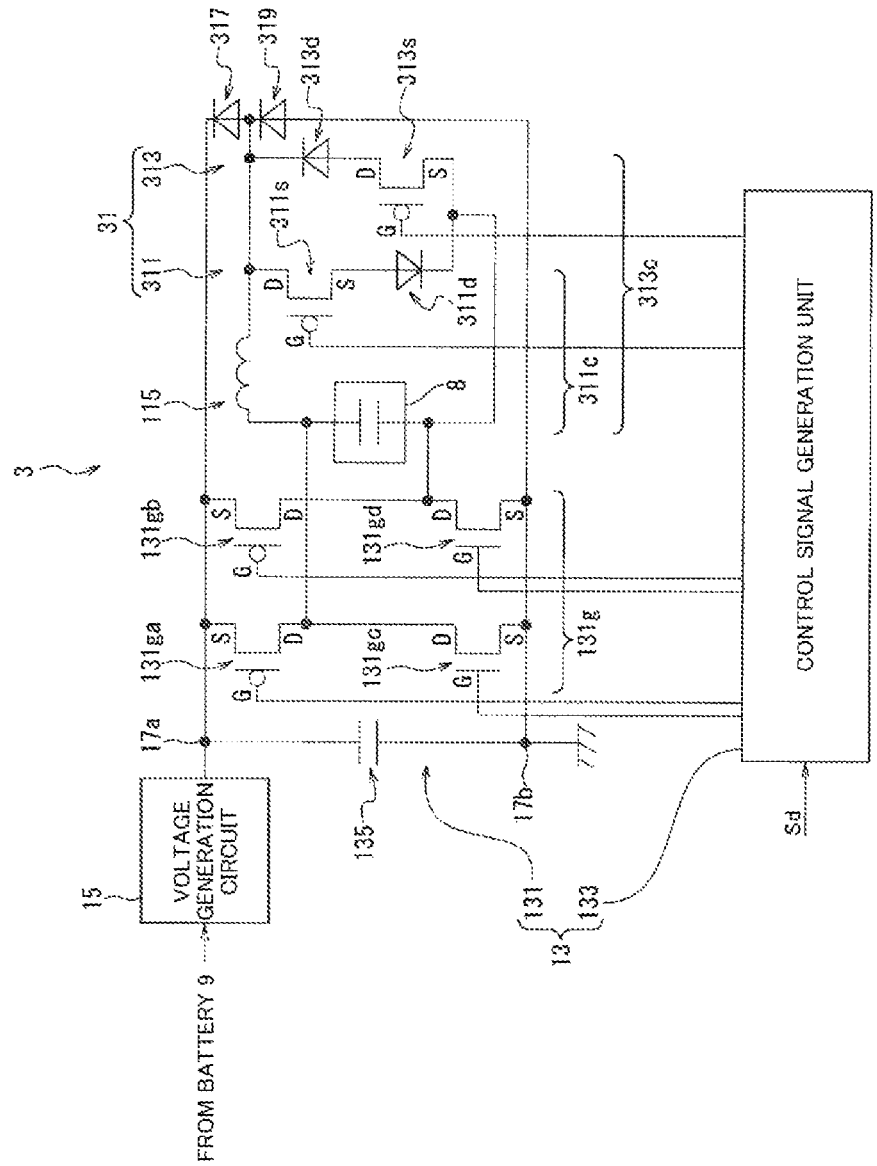
FIG. 7 is a circuit diagram illustrating an example of the configuration of a drive circuit according to a third embodiment of the present technique.

As illustrated in FIG. 7, a drive circuit 3 according to the present embodiment includes the control circuit 13, which controls the application of AC voltage to the capacitive load 8. The drive circuit 3 includes the inductive element 115, which constitutes a closed circuit 311c (an example of a first closed circuit) together with the capacitive load 8. The drive circuit 3 includes a diode 311d (an example of a first diode-type element) which is connected in series with the inductive element 115 between the capacitive load 8 and the inductive element 115 so as to constitute the closed circuit 311c. The diode 311d is constituted by a PN junction diode, for example. The drive circuit 3 includes a switch element 311s (an example of a first switch element) which is connected in series with the diode 311d between the capacitive load 8 and the inductive element 115 so as to constitute the closed circuit 311c. The switch element 311s is constituted by a P-type field effect transistor, for example.

More specifically, the one terminal of the inductive element 115 is connected to the one terminal of the capacitive load 8. The other terminal of the inductive element 115 is connected to a drain terminal D of the switch element 311s. A source terminal S of the switch element 311s is connected to an anode terminal of the diode 311d. A cathode terminal of the diode 311d is connected to the other terminal of the capacitive load 8. As a result, a current path for current flow is established by the inductive element 115, the switch element 311s, the diode 311d, and the capacitive load 8, which configures the closed circuit 311c.

As illustrated in FIG. 7, the drive circuit 3 includes a diode 313*d* (an example of a second diode-type element) which is connected in series with the inductive element 115 and in parallel with the diode 311*d* and the switch element 311*s* so as to constitute a closed circuit 313*c* (an example of a second closed circuit). The diode 313*d* is constituted by a PN junction diode, for example. The drive circuit 3 includes a switch element 313*s* (an example of a second switch element) which is connected in series with the diode 313*d* and in parallel with the diode 311*d* and the switch element 311*s* so as to constitute the closed circuit 313*c*. The switch element 313*s* is constituted by a P-type field effect transistor, for example.

More specifically, a cathode terminal of the diode 313*d* is connected to the other terminal of the inductive element 115 and the anode terminal of the diode 311*d*. An anode terminal of the diode 313*d* is connected to a drain terminal D of the switch element 313*s*. A source terminal S of the switch element 313*s* is connected to the cathode terminal of the diode 311*d* and the other terminal of the capacitive load 8. As a result, a current path for current flow is established by the inductive element 115, the diode 313*d*, the switch element 313*s*, and the capacitive load 8, which configures the closed circuit 313*c*.

As illustrated in FIG. 7, the drive circuit 3 includes an energy transfer unit 311 (an example of a first energy transfer unit) which is constituted by the inductive element 115, the diode 311*d*, and the switch element 311*s*, and which transfers energy stored in the capacitive load 8. The drive circuit 3 includes an energy transfer unit 313 (an example of a second energy transfer unit) which is constituted by the inductive element 115, the diode 313*d*, and the switch element 313*s*, and which transfers energy stored in the capacitive load 8. The drive circuit 3 includes an energy transfer circuit 31, which in turn includes the energy transfer unit 311 and the energy transfer unit 313.

The energy transfer unit 311 includes the diode 311*d*, for which the forward direction is the direction from the one terminal of the capacitive load 8 toward the other terminal of the capacitive load 8. The energy transfer unit 313 includes the diode 313*d*, for which the forward direction is the direction from the other terminal of the capacitive load 8 toward the one terminal of the capacitive load 8. Two terminals of the plurality of (six, in the present embodiment) output terminals that output the control signals in the control signal generation unit 133 are connected one-to-one to gate terminals G of the switch element 311*s* and the switch element 313*s*, respectively. Accordingly, the control circuit 13 can control the on/off states of the switch element 311*s* and the switch element 313*s* independently.

Accordingly, when energy based on the positive DC voltage is stored in the capacitive load 8, the energy transfer circuit 31 is controlled by the control circuit 13 to put the switch element 311*s* in an on state and the switch element 313*s* in an off state. As a result, a current path is established in the closed circuit 311*c*, and thus the energy stored in the capacitive load 8 is transferred to the inductive element 115 by the closed circuit 311*c*, and the DC voltage applied to both ends of the capacitive load 8 is stepped down.

On the other hand, when energy based on the negative DC voltage is stored in the capacitive load 8, the energy transfer circuit 31 is controlled by the control circuit 13 to put the switch element 311*s* in an off state and the switch element 313*s* in an on state. As a result, a current path is established in the closed circuit 313*c*, and thus the energy stored in the capacitive load 8 is transferred to the inductive element 115 by the closed circuit 313*c*, and the DC voltage applied to both ends of the capacitive load 8 is stepped up.

As illustrated in FIG. 7, the drive circuit 3 includes a reverse bias diode 317 (an example of a first reverse bias diode-type element) connected between a point between the capacitive load 8 and the inductive element 115, and the supply end 17*a* (an example of a first supply end) for the positive-side DC potential (an example of a first DC potential). The reverse bias diode 317 is constituted by a PN junction diode, for example. A cathode terminal of the reverse bias diode 317 is connected to the supply end 17*a* from which the positive-side DC potential is output, the source terminal S of the switch element 131*ga*, and the source terminal S of the switch element 131*gb*. An anode terminal of the reverse bias diode 317 is connected to the drain terminal D of the switch element 311*s* and the cathode terminal of the diode 313*d*. The positive-side DC potential is a high level-side potential of the voltage generated by the voltage generation circuit 15. The supply end 17*a* is a terminal for supplying a voltage generated by the voltage generation circuit 15 to the capacitive load 8 via the control circuit 13. Accordingly, a reverse bias is applied to the reverse bias diode 317 by the positive-side DC potential.

The drive circuit 3 includes a reverse bias diode 319 (an example of a second reverse bias diode-type element) connected between a point between the capacitive load 8 and the inductive element 115, and the supply end 17*b* (an example of a second supply end) for the reference DC potential (an example of a second DC potential). The reverse bias diode 319 is constituted by a PN junction diode, for example. An anode terminal of the reverse bias diode 319 is connected to the supply end 17*b* for the reference current potential, the source terminal of the switch element 131*gc*, and the source terminal S of the switch element 131*gd*. A cathode terminal of the reverse bias diode 319 is connected to the anode terminal of the reverse bias diode 317, the drain terminal D of the switch element 311*s*, and the cathode terminal of the diode 313*d*. The supply end 17*b* for the reference current potential is a ground terminal. Accordingly, a reverse bias is applied to the reverse bias diode 317 by the reference DC potential.

The closed circuit 311*c* and the closed circuit 313*c* according to the present embodiment are not directly connected to the supply end 17*a* and the supply end 17*b*, as in the foregoing first embodiment. Thus when the drive circuit 3 drives the capacitive load 8, transfer loss in the transfer of energy from the capacitive load 8 to the energy transfer circuit 31 can be reduced. The drive circuit 3 can therefore reduce power consumption when driving the capacitive load 8.

Additionally, because the closed circuits 311*c* and 313*c* are not directly connected to constant voltage parts such as the output terminal of the voltage generation circuit 15 and ground terminals, the voltage across both terminals of the capacitive load 8 may deviate from the potential difference between the supply end 17*a* and the supply end 17*b*, in the same manner as in the foregoing first embodiment. However, the drive circuit 3 includes the reverse bias diode 317 and the reverse bias diode 319, which are connected to the energy transfer circuit 31. Accordingly, in both the closed circuit 311*c* and the closed circuit 313*c*, a point between the terminals of the capacitive load 8 and the inductive element 115 that are not connected to each other (i.e., a point between the other terminals of the capacitive load 8 and the inductive element 115) is electrically connected to the output terminal of the voltage generation circuit 15 by the reverse bias diode 317 and the supply end 17*a*. Furthermore, in both the closed circuit 311c and the closed circuit 313c, a point between the terminals of the capacitive load 8 and the inductive element 115 that are not connected to each other (i.e., a point between the other terminals of the capacitive load 8 and the inductive element 115) is electrically connected to the supply unit for the reference current potential (the ground terminal) by the reverse bias diode 319 and the supply end 17b. Thus in the drive circuit 3, the voltage across both terminals of the capacitive load 8 is prevented from deviating from the potential difference between the supply end 17a and the supply end 17b, even when the capacitive load 8 repeatedly charges and discharges.

Method of Controlling Drive Circuit

In the drive circuit 3, the energy transfer unit 311 is provided with the switch element 311s constituted by a P-type field effect transistor. On the other hand, in the drive circuit 1 according to the foregoing first embodiment, the energy transfer unit 111 is provided with the switch element 111s constituted by an N-type field effect transistor. Accordingly, in the method of controlling the drive circuit 3 according to the present embodiment, the gate signal of the switch element 311s differs from the gate signal of the switch element 111s (see FIG. 4) in the method of controlling the drive circuit 1 according to the foregoing first embodiment. Specifically, the gate signal of the switch element 311s is a signal in which the inversion timing is the same as that of the gate signal of the switch element 111s, but the voltage level is reversed. To describe this with reference to FIG. 4, the gate signal of the switch element 311s is a voltage waveform which is at high level from time t0 to time t2, low level from time t2 to time t4, and high level from time t4 on. Through this, the energy transfer unit 311 provided in the drive circuit 3 can operate in the same manner as the energy transfer unit 111 provided in the drive circuit 1. As a result, the drive circuit 3 can be controlled in the same manner as the drive circuit 1.

As described thus far, the drive circuit, the electronic device, and the method of controlling a drive circuit according to the present embodiment can provide the same effects as the drive circuits, the electronic devices, and the methods of controlling a drive circuit according to the foregoing first embodiment and second embodiment.

Variation on Method of Controlling Drive Circuit

Figure 8A:
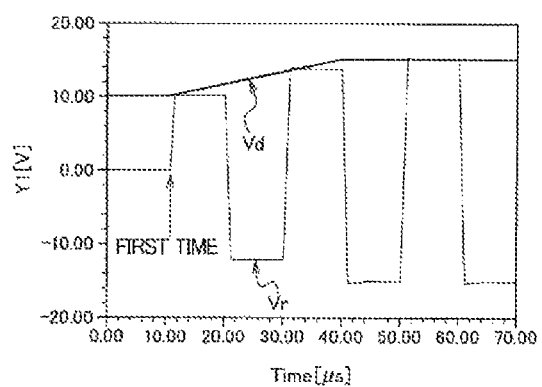
FIG. 8A is a diagram (No. 1) illustrating a variation on a method of controlling a drive circuit which can be applied to the drive circuits according to the first embodiment to the third embodiment of the present technique.
Figure 8A:
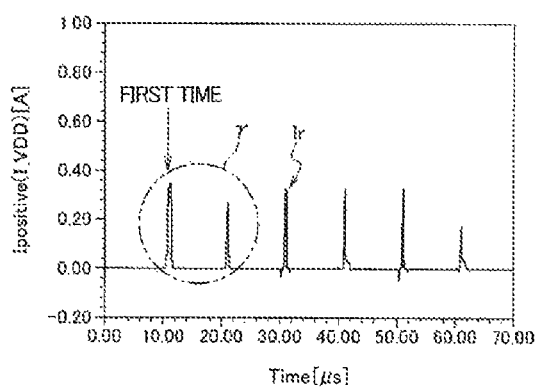
Figure 8B:
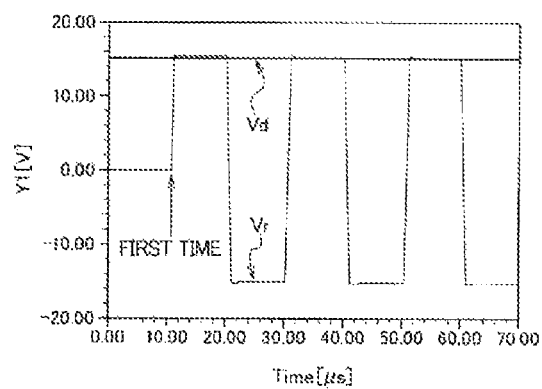
FIG. 8B is a diagram (No. 2) illustrating a variation on a method of controlling a drive circuit which can be applied to the drive circuits according to the first embodiment to the third embodiment of the present technique.
Figure 8B:
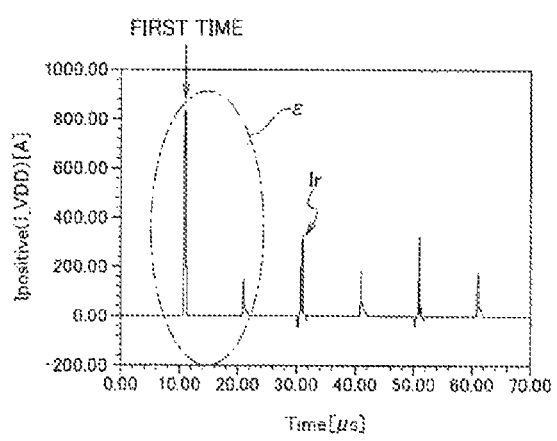

A variation on a method of controlling a drive circuit which can be applied to the drive circuits according to the first embodiment to the third embodiment will be described next with reference to FIG. 8A and FIG. 8B. FIG. 8A and FIG. 8B are diagrams illustrating examples of control waveforms for describing the present variation. FIG. 8A illustrates an example of the control waveform when the method of controlling a drive circuit according to the present variation is applied. FIG. 8B illustrates an example of the control waveform according to a comparative example, in which the method of controlling a drive circuit according to the present variation is not applied. The upper sections in FIG. 8A and FIG. 8B indicate voltage waveforms of the control signals of the drive circuit, and the lower sections indicate current waveforms of the control signals of the drive circuit. "Vd" in FIG. 8A and FIG. 8B represents the voltage waveform of a drive power source for driving a capacitive load. "Vr" in FIG. 8A and FIG. 8B represents the voltage waveform of a load voltage applied to the capacitive load. "Ir" in FIG. 8A and FIG. 8B represents the current waveform of a load current flowing in the capacitive load. Note that in the descriptions of the present variation, the reference signs of the drive circuit according to the foregoing first embodiment, indicated in FIG. 3, will be used.

As indicated in the upper section of FIG. 8A, in the method of controlling the drive circuit 1 according to the present variation, the voltage level of a first load voltage (an example of an AC voltage) is set to be lower than the voltage level of the second and subsequent load voltages and applied to the capacitive load.

Incidentally, to invert the voltage applied to the capacitive load, a greater current amount is required when no energy is stored in the capacitive load (when the load is not charged) than when energy is stored in the capacitive load (when the load is charged). Before the drive circuit starts operating, there is no energy stored in the capacitive load. Accordingly, in order to fully charge the capacitive load in the first instance of driving, it is necessary for the drive circuit to apply the drive power source to the capacitive load at a target voltage level and also provide the current necessary to fully charge the capacitive load. Such being the case, as indicated in the upper section of FIG. 8B, the load voltage Vr applied to the capacitive load by the drive power source Vd at the target voltage level becomes the target voltage level during the first instance of driving. However, as indicated by a circular frame ε in the lower section of FIG. 8B, the load current Ir during the first instance of driving is approximately three times larger than the load current Ir in the second and subsequent instances of driving. This increases the power consumption of the drive circuit and makes it necessary to configure the drive circuit using high-voltage switch elements and diodes.

As opposed to this, as indicated by the drive power source Vd in FIG. 8A, in the drive circuit 1 according to the present variation, the drive power source for driving the capacitive load 8 (i.e., the output voltage of the voltage generation circuit 15) before the drive circuit 1 begins operating is set to a lower voltage level than the target driving voltage for driving the capacitive load 8 (e.g., ⅔ the voltage level of that driving voltage). Furthermore, in the drive circuit 1 according to the present variation, after the operations have begun, the voltage level of the drive power source for driving the capacitive load 8 is set to gradually approach the target voltage level for the drive power source.

Through this, as indicated in the upper section of FIG. 8A, the load voltage Vr of the capacitive load 8 does not reach the target voltage level in several (four, in the present variation) inversion operations after the drive circuit 1 begins operating. However, as indicated by a circular frame γ in the lower section of FIG. 8A, the load current Ir during the first instance of driving is approximately the same as the load current Ir in the second and subsequent instances of driving. This makes it possible for the drive circuit 1 to reduce power consumption and lower the breakdown voltage of constituent components such as the switch element 111s and the diode 111d.

4. Fourth Embodiment

A drive circuit, an electronic device, and a method of controlling a drive circuit according to a fourth embodiment of the present technique will be described with reference to FIG. 9 to FIG. 11. Aside from the fact that a plurality of capacitive loads can be driven, the electronic device according to the present embodiment has the same configuration and provides the same functions as the electronic device ED according to the foregoing first embodiment, and will therefore not be described. Note that in the present embodiment, the battery provided in the electronic device will be described using the "battery 9" provided in the electronic device ED according to the foregoing first embodiment.

Example of Configuration of Drive Circuit

Figure 9:
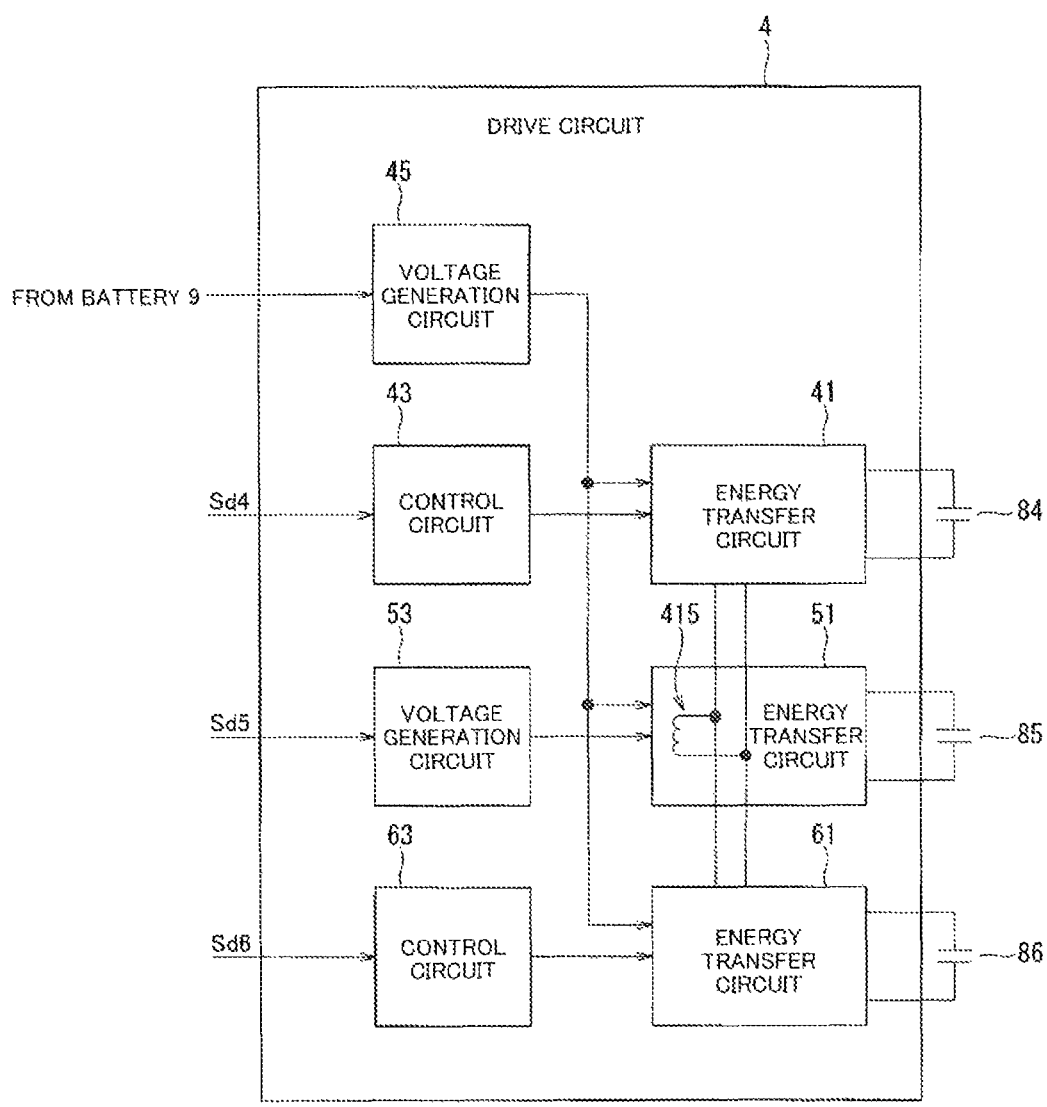
FIG. 9 is a block diagram illustrating an example of the configuration of a drive circuit according to a fourth embodiment of the present technique.

FIG. 9 is a block diagram illustrating an example of the configuration of a drive circuit 4 according to the fourth embodiment of the present technique. As illustrated in FIG. 9, the drive circuit 4 includes: a voltage generation circuit 45 connected to the battery 9 (not shown in FIG. 9); and a control circuit 43 (an example of a first control circuit) to which a drive signal Sd4 is input. The drive circuit 4 includes a control circuit 53 (an example of a second control circuit) to which a drive signal Sd5 is input, and a control circuit 63 (an example of a second control circuit) to which a drive signal Sd6 is input. The drive circuit 4 includes an energy transfer circuit 41 connected to the voltage generation circuit 45 and the control circuit 43, an energy transfer circuit 51 connected to the voltage generation circuit 45 and the control circuit 53, and an energy transfer circuit 61 connected to the voltage generation circuit 45 and the control circuit 63. A capacitive load 84 (an example of a first capacitive load) is connected to the energy transfer circuit 41. A capacitive load 85 (an example of a second capacitive load) is connected to the energy transfer circuit 51. A capacitive load 86 (an example of a second capacitive load) is connected to the energy transfer circuit 61.

The voltage generation circuit 45 boosts the DC voltage (e.g., 3.5 V) input from the battery 9 and outputs the boosted DC voltage (e.g., 5 V to 15 V) to the energy transfer circuits 41, 51, and 61. The voltage generation circuit 45 is constituted by a direct current to direct current (DC-DC) voltage transform circuit that can change an output voltage within a predetermined range.

The control circuit 43 is a circuit that controls the application of AC voltage to the capacitive load 84. The control circuit 43 generates a control signal that controls the energy transfer circuit 41 on the basis of the drive signal Sd4 input from the exterior. The control circuit 53 is a circuit that controls the application of AC voltage to the capacitive load 85. The control circuit 53 generates a control signal that controls the energy transfer circuit 51 on the basis of the drive signal Sd5 input from the exterior. The control circuit 63 is a circuit that controls the application of AC voltage to the capacitive load 86. The control circuit 63 generates a control signal that controls the energy transfer circuit 61 on the basis of the drive signal Sd6 input from the exterior. The control circuits 43, 53, and 63 will be described in detail later.

The energy transfer circuit 41 is a circuit that transfers energy stored in the capacitive load 84 to an inductive element 415 when the capacitive load 84 is driven. The drive circuit 4 drives the capacitive load 84 by supplying power from the voltage generation circuit 45. The energy transfer circuit 51 is a circuit that transfers energy stored in the capacitive load 85 to the inductive element 415 when the capacitive load 85 is driven. The drive circuit 4 drives the capacitive load 85 by supplying power from the voltage generation circuit 45. The energy transfer circuit 61 is a circuit that transfers energy stored in the capacitive load 86 to the inductive element 415 when the capacitive load 86 is driven. The drive circuit 4 drives the capacitive load 86 by supplying power from the voltage generation circuit 45. Although details will be given later, when driving the capacitive loads 84, 85, and 86 independently, the drive circuit 4 can supply power from the voltage generation circuit 45 while charging and discharging the capacitive loads 84, 85, and 86 independently using the energy transfer circuits 41, 51, and 61. This makes it possible for the drive circuit 4 to achieve low power consumption. Additionally, the drive circuit 4 is configured so that the inductive element which transfers the energy stored in the capacitive loads 84, 85, and 86 is shared by the energy transfer circuits 41, 51, and 61. Although it is easy to implement field effect transistors, diodes, and the like in ICs, inductive elements at the micro-Henry (pH) order are extremely difficult to implement in ICs. With the drive circuit 4 according to the present embodiment, having the inductive element shared by the energy transfer circuits 41, 51, and 61 makes it possible to prevent the drive circuit 4 from becoming larger even if the inductive element is provided externally.

The specific circuit configuration of the drive circuit 4 according to the present embodiment will be described next with reference to FIG. 10. FIG. 10 is a circuit diagram illustrating an example of the configuration of the drive circuit 4.

Figure 10:
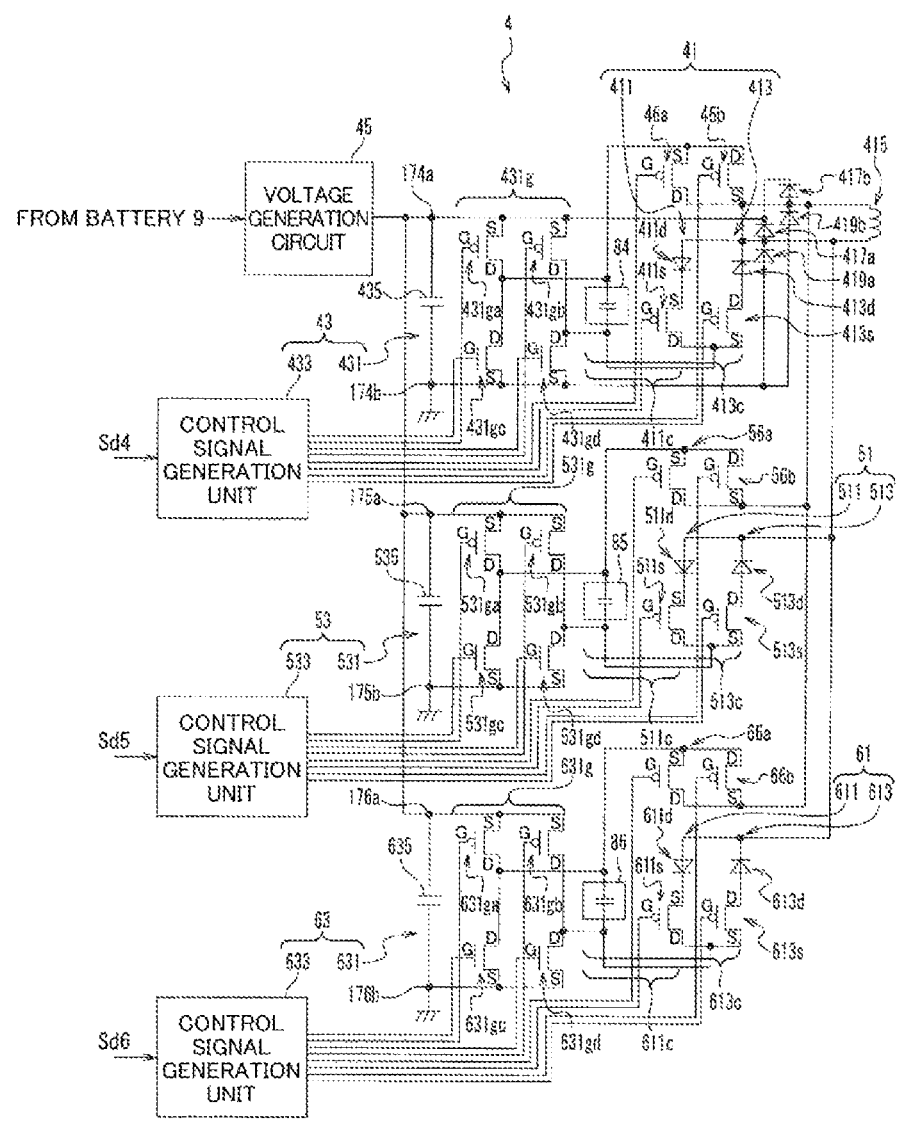
FIG. 10 is a circuit diagram illustrating an example of the configuration of the drive circuit according to the fourth embodiment of the present technique.

As illustrated in FIG. 10, the drive circuit 4 includes the control circuit 43, which controls the application of AC voltage to the capacitive load 84. The drive circuit 4 includes the inductive element 415, which constitutes a closed circuit 411c (an example of a first closed circuit) together with the capacitive load 84. The drive circuit 4 includes a diode 411d (an example of a first diode-type element) which is connected in series with the inductive element 415 between the capacitive load 84 and the inductive element 415 so as to constitute the closed circuit 411c. The diode 411d is constituted by a PN junction diode, for example. The drive circuit 4 includes a switch element 411s (an example of a first switch element) which is connected in series with the diode 411d between the capacitive load 84 and the inductive element 415 so as to constitute the closed circuit 411c. The switch element 411s is constituted by a P-type field effect transistor, for example.

More specifically, one terminal of the inductive element 415 is connected to one terminal of the capacitive load 84 by disconnecting switch elements 46a and 46b (described in detail later). The other terminal of the inductive element 415 is connected to an anode terminal of the diode 411d. A cathode terminal of the diode 411d is connected to a source terminal S of the switch element 411s. A drain terminal D of the switch element 411s is connected to the other terminal of the capacitive load 84. As a result, a current path for current flow is established by the capacitive load 84, disconnecting switch elements 46a and 46b, the inductive element 415, the diode 411d, and the switch element 411s, which configures the closed circuit 411c.

As illustrated in FIG. 10, the drive circuit 4 includes a diode 413d (an example of a second diode-type element) which is connected in series with the inductive element 415 and in parallel with the diode 411d and the switch element 411s so as to constitute a closed circuit 413c (an example of a second closed circuit). The diode 413d is constituted by a PN junction diode, for example. The drive circuit 4 includes a switch element 413s (an example of a second switch element) which is connected in series with the diode 413d and in parallel with the diode 411d and the switch element 411s so as to constitute the closed circuit 413c. The switch element 413s is constituted by a P-type field effect transistor, for example.

More specifically, a cathode terminal of the diode 413d is connected to the other terminal of the inductive element 415 and the anode terminal of the diode 411d. An anode terminal of the diode 413*d* is connected to a drain terminal D of the switch element 413*s*. A source terminal S of the switch element 413*s* is connected to the drain terminal D of the switch element 411*s* and the other terminal of the capacitive load 84. As a result, a current path for current flow is established by the capacitive load 84, the switch element 413*s*, the diode 413*d*, the inductive element 415, and the disconnecting switch elements 46*a* and 46*b*, which configures the closed circuit 413*c*.

As illustrated in FIG. 10, the control circuit 43 provided in the drive circuit 4 includes a bridge circuit 431 (an example of a first bridge circuit) which is constituted by a switch element group 431*g* (an example of a first switch element group) having a plurality of (four, in the present embodiment) switch elements 431*ga* to 431*gd* and which is connected to both ends of the capacitive load 84. The control circuit 43 also includes a control signal generation unit 433 (a first control signal generation unit) that generates control signals which control the switching of the plurality of switch elements 431*ga* to 431*gd*, the switch element 411*s*, and the switch element 413*s*.

The bridge circuit 431 is connected between a supply end 174*a* (an example of a first supply end) for a positive-side DC potential (an example of a first DC potential) and a supply end 174*b* (an example of a second supply end) for a reference DC potential (an example of a second DC potential). The positive-side DC potential is a high level-side potential of the voltage generated by the voltage generation circuit 45. The supply end 174*b* for the reference DC potential is a ground terminal. A reference potential terminal of the voltage generation circuit 45 is connected to this ground terminal. The voltage generated by the voltage generation circuit 45 corresponds to a potential difference between the positive-side DC potential and the reference DC potential. Accordingly, the voltage generated by the voltage generation circuit 45 is applied to both ends of the bridge circuit 431.

The control circuit 43 includes a capacitor 435 provided between the supply end 174*a* and the supply end 174*b*. One electrode of the capacitor 435 is connected to the supply end 174*a*, and another electrode of the capacitor 435 is connected to the supply end 174*b*. The capacitor 435 is provided in order to prevent fluctuations in the voltage output from the voltage generation circuit 45. Accordingly, an almost constant voltage is supplied to both ends of the bridge circuit 431.

The bridge circuit 431 has a full bridge circuit configuration, constituted by the four switch elements 431*ga* to 431*gd*. The switch element 431*ga* and the switch element 431*gb* are constituted by P-type field effect transistors, for example. The switch element 431*gc* and the switch element 431*gd* are constituted by N-type field effect transistors, for example.

A source terminal S of the switch element 431*ga* is connected to the supply end 174*a* and a source terminal S of the switch element 431*gb*. A drain terminal D of the switch element 431*ga* is connected to a drain terminal D of the switch element 431*gc*. A drain terminal D of the switch element 431*gb* is connected to a drain terminal D of the switch element 431*gd*. A source terminal S of the switch element 431*gc* and a source terminal S of the switch element 431*gd* are connected to the supply end 174*b*.

The drain terminal D of the switch element 431*ga* and the drain terminal D of the switch element 431*gc* are connected to the one terminal of the capacitive load 84 and source terminals S of the disconnecting switch elements 46*a* and 46*b*. The drain terminal D of the switch element 431*ga* and the drain terminal D of the switch element 431*gc* are connected to the one terminal of the inductive element 415 by the disconnecting switch elements 46*a* and 46*b*. The drain terminal D of the switch element 431*gb* and the drain terminal D of the switch element 431*gd* are connected to the other terminal of the capacitive load 84, as well as to the source terminal S of the switch element 411*s* and the source terminal S of the switch element 413*s*.

Accordingly, when the switch element 431*ga* and the switch element 431*gd* are in an on state, and the switch element 431*gb* and the switch element 431*gc* are in an off state, the one terminal of the capacitive load 84 is electrically connected to the supply end 174*a* by the switch element 431*ga*, and the other terminal of the capacitive load 84 is connected to the supply end 174*b* by the switch element 431*gd*. Accordingly, when the switch elements 431*ga* and 431*gd* are in an on state and the switch elements 431*gb* and 431*gc* are in an off state, the positive-side DC potential is applied to the one terminal of the capacitive load 84, and the negative-side DC potential is applied to the other terminal of the capacitive load 84. As a result, the DC voltage applied to both ends of the capacitive load 84 is a positive voltage.

Additionally, when the switch element 431*ga* and the switch element 431*gd* are in an off state, and the switch element 431*gb* and the switch element 431*gc* are in an on state, the one terminal of the capacitive load 84 is electrically connected to the supply end 174*b* by the switch element 431*gc*, and the other terminal of the capacitive load 84 is connected to the supply end 174*a* by the switch element 431*gb*. Accordingly, when the switch elements 431*ga* and 431*gd* are in an off state and the switch elements 431*gb* and 431*gc* are in an on state, the negative-side DC potential is applied to the one terminal of the capacitive load 84, and the positive-side DC potential is applied to the other terminal of the capacitive load 84. As a result, the DC voltage applied to both ends of the capacitive load 84 is a negative voltage.

The control signal generation unit 433 includes a plurality of (eight, in the present embodiment) output terminals that output a plurality of control signals generated on the basis of the drive signal Sd4 input from the exterior. Four terminals of the plurality of output terminals in the control signal generation unit 433 are connected one-to-one to gate terminals G of respective ones of the four switch elements 431*ga* to 431*gd*. Accordingly, the control circuit 43 can control the on/off states of the four switch elements 431*ga* to 431*gd* independently, and can apply an AC voltage in which the polarity of the DC voltage inverts to both ends of the capacitive load 8.

As illustrated in FIG. 10, the drive circuit 4 includes an energy transfer unit 411 (an example of a first energy transfer unit) which is constituted by the inductive element 415, the diode 411*d*, and the switch element 411*s*, and which transfers energy stored in the capacitive load 84. The drive circuit 4 includes an energy transfer unit 413 (an example of a second energy transfer unit) which is constituted by the inductive element 415, the diode 413*d*, and the switch element 413*s*, and which transfers energy stored in the capacitive load 84. The drive circuit 4 includes the energy transfer circuit 41, which in turn includes the energy transfer unit 411 and the energy transfer unit 413.

The energy transfer unit 411 includes the diode 411*d*, for which the forward direction is the direction from the one terminal of the capacitive load 84 toward the other terminal of the capacitive load 84. The energy transfer unit 413 includes the diode 413*d*, for which the forward direction is the direction from the other terminal of the capacitive load 84 toward the one terminal of the capacitive load 84. Two of the remaining four terminals of the plurality of output terminals that output the control signals in the control signal generation unit 433 are connected one-to-one to gate terminals G of the switch element 411*s* and the switch element 413*s*, respectively. Accordingly, the control circuit 43 can control the on/off states of the switch element 411*s* and the switch element 413*s* independently.

Accordingly, when energy based on the positive DC voltage is stored in the capacitive load 84, the energy transfer circuit 41 is controlled by the control circuit 43 to put the switch element 411*s* in an on state and the switch element 413*s* in an off state. As a result, a current path is established in the closed circuit 411*c*, and thus the energy stored in the capacitive load 84 is transferred to the inductive element 415 by the closed circuit 411*c*, and the DC voltage applied to both ends of the capacitive load 84 is stepped down.

On the other hand, when energy based on the negative DC voltage is stored in the capacitive load 84, the energy transfer circuit 41 is controlled by the control circuit 43 to put the switch element 411*s* in an off state and the switch element 413*s* in an on state. As a result, a current path is established in the closed circuit 413*c*, and thus the energy stored in the capacitive load 84 is transferred to the inductive element 415 by the closed circuit 413*c*, and the DC voltage applied to both ends of the capacitive load 84 is stepped up.

As illustrated in FIG. 10, the drive circuit 4 includes reverse bias diodes 417*a* and 417*b* (an example of a first reverse bias diode-type element) connected between a point between the capacitive load 84 and the inductive element 415, and the supply end 174*a* (an example of a first supply end) for the positive-side DC potential (an example of a first DC potential). Cathode terminals of the reverse bias diode 417*a* and the reverse bias diode 417*b* are connected to the supply end 174*a* from which the positive-side DC potential is output. An anode terminal of the reverse bias diode 417*a* is connected to the other terminal of the inductive element 415, the anode terminal of the diode 411*d*, and the cathode terminal of the diode 413*d*. An anode terminal of the reverse bias diode 417*b* is connected to the one terminal of the inductive element 415, a drain terminal D of the disconnecting switch element 46*a*, and a source terminal S of the disconnecting switch element 46*b*. The positive-side DC potential is a high level-side potential of the voltage generated by the voltage generation circuit 45. The supply end 174*a* is a terminal for supplying a voltage generated by the voltage generation circuit 45 to the capacitive load 84 via the control circuit 43. Accordingly, a reverse bias is applied to the reverse bias diodes 417*a* and 417*b* by the positive-side DC potential.

The drive circuit 4 includes reverse bias diodes 419*a* and 419*b* (an example of a second reverse bias diode-type element) connected between a point between the capacitive load 84 and the inductive element 415, and the supply end 174*b* (an example of a second supply end) for the reference DC potential (an example of a second DC potential). Anode terminals of the reverse bias diode 419*a* and the reverse bias diode 419*b* are connected to the supply end 174*b* from which the reference current potential is output. A cathode terminal of the reverse bias diode 419*a* is connected to the other terminal of the inductive element 415, the anode terminal of the diode 411*d*, and the cathode terminal of the diode 413*d*. A cathode terminal of the reverse bias diode 419*b* is connected to the one terminal of the inductive element 415, the anode terminal of the reverse bias diode 417*b*, the drain terminal D of the disconnecting switch element 46*a*, and the source terminal S of the disconnecting switch element 46*b*. The supply end 174*b* for the reference current potential is a ground terminal. Accordingly, a reverse bias is applied to the reverse bias diodes 419 and 419*b* by the reference DC potential.

Incidentally, the closed circuit 411*c* and the closed circuit 413*c* are not directly connected to the supply end 174*a* and the supply end 174*b*. As such, the drive circuit 4 does not have a path through which current flows from the capacitive load 84 to the voltage generation circuit 45, the supply end 174*b* (ground terminal) for the reference current potential, and so on. Accordingly, when the drive circuit 4 transfers energy from the capacitive load 84 to the energy transfer circuit 41, the energy stored in the capacitive load 84 is prevented from being discharged to the voltage generation circuit 45, the ground terminal, and so on. Thus when the drive circuit 4 drives the capacitive load 84, transfer loss in the transfer of energy from the capacitive load 84 to the energy transfer circuit 41 can be reduced. The drive circuit 4 can therefore reduce power consumption when driving the capacitive load 84.

However, because the closed circuits 411*c* and 413*c* are not directly connected to constant voltage parts such as the output terminal of the voltage generation circuit 45 and ground terminals, the voltage across both terminals of the capacitive load 84 may deviate from the potential difference between the supply end 174*a* and the supply end 174*b* as the capacitive load 84 repeatedly charges and discharges. However, as described above, the drive circuit 4 includes the reverse bias diodes 417*a* and 417*b* and the reverse bias diodes 419*a* and 419*b*, which are connected to the energy transfer circuit 41. Accordingly, a point between the terminals of the capacitive load 84 and the inductive element 415 that are not connected to each other via the disconnecting switch elements 46*a* and 46*b* in the closed circuit 411*c* (i.e., a point between the other terminals of the capacitive load 84 and the inductive element 415) is electrically connected to the output terminal of the voltage generation circuit 45 by the reverse bias diode 417*a* and the supply end 174*a*. Likewise, a point between the terminals of the capacitive load 84 and the inductive element 415 that are not connected to each other in the closed circuit 413*c* (i.e., a point between the other terminals of the capacitive load 84 and the inductive element 415) is electrically connected to the supply unit for the reference current potential (the ground terminal) by the reverse bias diode 419*a* and the supply end 174*b*. Thus in the drive circuit 4, the voltage across both terminals of the capacitive load 84 is prevented from deviating from the potential difference between the supply end 174*a* and the supply end 174*b*, even when the capacitive load 84 repeatedly charges and discharges.

The drive circuit 4 includes the disconnecting switch elements 46*a* and 46*b* (an example of a first disconnecting switch element), which are connected in series with the capacitive load 84 and the inductive element 415 between the capacitive load 84 and the inductive element 415, and which electrically disconnect the inductive element 415 from the closed circuit 411*c* and the closed circuit 413*c*. The disconnecting switch element 46*a* and the disconnecting switch element 46*b* are both constituted by P-type field effect transistors, for example. A source terminal S of the disconnecting switch element 46*a* is connected to the one terminal of the capacitive load 84 and a drain terminal D of the disconnecting switch element 46*b*. The drain terminal D of the disconnecting switch element 46*a* is connected to the one terminal of the inductive element 415 and the source terminal S of the disconnecting switch element 46*b*. Gate terminals G of the disconnecting switch element 46*a* and the disconnecting switch element 46*b* are connected one-to-one to the remaining (two) terminals of the plurality of output terminals that output the control signals of the control signal generation unit 433. Accordingly, the control circuit 43 can control the on/off states of the disconnecting switch element 46*a* and the disconnecting switch element 46*b* independently.

As described above, the inductive element 415 is shared by the energy transfer circuit 41, the energy transfer circuit 51, and the energy transfer circuit 61. Accordingly, when energy is transferred from the capacitive load 84 to the inductive element 415 by the energy transfer circuit 41, the drive circuit 4 sets all the disconnecting switch elements connected to the energy transfer circuits 51 and 61 (described in detail later) to an off state. Through this, the drive circuit 4 can electrically disconnect the energy transfer circuits 51 and 61 from the inductive element 415, and prevent the occurrence of problems in the transfer of energy from the capacitive load 84 to the inductive element 415 by the energy transfer circuit 41.

When energy based on the positive DC voltage is stored in the capacitive load 84, the control circuit 43 controls the disconnecting switch element 46*a* to enter an on state and the disconnecting switch element 46*b* to enter an off state. As a result, the capacitive load 84, the disconnecting switch element 46*a*, the inductive element 415, the diode 411*d*, and the switch element 411*s* are electrically connected, and a current path is established in the closed circuit 411*c*. Accordingly, the energy stored in the capacitive load 84 is transferred to the inductive element 415 by the closed circuit 411*c*. When energy based on the negative DC voltage is stored in the capacitive load 84, the control circuit 43 controls the disconnecting switch element 46*a* to enter an off state and the disconnecting switch element 46*b* to enter an on state. As a result, the capacitive load 84, the switch element 413*s*, the diode 413*d*, the inductive element 415, and the disconnecting switch element 46*b* are electrically connected, and a current path is established in the closed circuit 413*c*. Accordingly, the energy stored in the capacitive load 84 is transferred to the inductive element 415 by the closed circuit 413*c*.

The energy transfer circuit 51 and the control circuit 53 provided in the drive circuit 4 will be described next. As illustrated in FIG. 10, the drive circuit 4 includes the control circuit 53, which controls the application of AC voltage to the capacitive load 85. The drive circuit 4 includes a diode 511*d* (an example of a third diode-type element) which is connected in series with the inductive element 415 between the capacitive load 85 and the inductive element 415 so as to constitute a closed circuit 511*c* (an example of a third closed circuit). The diode 511*d* is constituted by a PN junction diode, for example. The drive circuit 4 includes a switch element 511*s* (an example of a third switch element) which is connected in series with the diode 511*d* between the capacitive load 85 and the inductive element 415 so as to constitute the closed circuit 511*c*. The switch element 511*s* is constituted by a P-type field effect transistor, for example.

The drive circuit 4 includes a diode 513*d* (an example of a fourth diode-type element) which is connected in series with the inductive element 415 and in parallel with the diode 511*d* and the switch element 511*s* so as to constitute a closed circuit 513*c* (an example of a fourth closed circuit). The diode 513*d* is constituted by a PN junction diode, for example. The drive circuit 4 includes a switch element 513*s* (an example of a fourth switch element) which is connected in series with the diode 513*d* and in parallel with the diode 511*d* and the switch element 511*s* so as to constitute the closed circuit 513*c*. The switch element 513*s* is constituted by a P-type field effect transistor, for example.

The control circuit 53 provided in the drive circuit 4 includes a bridge circuit 531 (an example of a second bridge circuit) which is constituted by a switch element group 531*g* (an example of a second switch element group) having a plurality of (four, in the present embodiment) switch elements 531*ga* to 531*gd* and which is connected to both ends of the capacitive load 85. The control circuit 53 also includes a control signal generation unit 533 (an example of a second control signal generation unit) that generates control signals which control the switching of the plurality of switch elements 531*ga* to 531*gd*, the switch element 511*s*, and the switch element 513*s*.

The bridge circuit 531 is connected between a supply end 175*a* (an example of a first supply end) for a positive-side DC potential (an example of a first DC potential) and a supply end 175*b* (an example of a second supply end) for a reference DC potential (an example of a second DC potential). The positive-side DC potential is a high level-side potential of the voltage generated by the voltage generation circuit 45. The supply end 175*b* for the reference DC potential is a ground terminal. A reference potential terminal of the voltage generation circuit 45 is connected to this ground terminal. The voltage generated by the voltage generation circuit 45 corresponds to a potential difference between the positive-side DC potential and the reference DC potential. Accordingly, the voltage generated by the voltage generation circuit 45 is applied to both ends of the bridge circuit 531.

The control circuit 53 includes a capacitor 535 provided between the supply end 175*a* and the supply end 175*b*. One electrode of the capacitor 535 is connected to the supply end 175*a*, and another electrode of the capacitor 535 is connected to the supply end 175*b*. The capacitor 535 is provided in order to prevent fluctuations in the voltage output from the voltage generation circuit 45. Accordingly, an almost constant voltage is supplied to both ends of the bridge circuit 531.

The configuration of the bridge circuit 531 is the same as the configuration of the bridge circuit 431, and will therefore not be described in detail. In other words, the bridge circuit 531 has the same configuration as the bridge circuit 431 when the switch element 431*ga* provided in the bridge circuit 431 is replaced with the switch element 531*ga*, the switch element 431*gb* is replaced with the switch element 531*gb*, the switch element 431*gc* is replaced with the switch element 531*gc*, and the switch element 431*gd* is replaced with the switch element 531*gd*; the supply end 174*a* is replaced with the supply end 175*a* and the supply end 174*b* is replaced with the supply end 175*b*; the capacitive load 84 is replaced with the capacitive load 85, and the control signal generation unit 433 is replaced with the control signal generation unit 533.

As illustrated in FIG. 10, the drive circuit 4 includes an energy transfer unit 511 (an example of a third energy transfer unit) which is constituted by the inductive element 415, the diode 511*d*, and the switch element 511*s*, and which transfers energy stored in the capacitive load 85. The drive circuit 4 includes an energy transfer unit 513 (an example of a fourth energy transfer unit) which is constituted by the inductive element 415, the diode 513*d*, and the switch element 513*s*, and which transfers energy stored in the capacitive load 85. The drive circuit 4 includes the energy transfer circuit 51 (an example of a second energy transfer circuit), which in turn includes the energy transfer unit 511 and the energy transfer unit 513.

The drive circuit 4 includes disconnecting switch elements 56a and 56b (an example of a second disconnecting switch element), which are connected in series with the capacitive load 85 and the inductive element 415 between the capacitive load 85 and the inductive element 415, and which electrically disconnect the inductive element 415 from the closed circuit 511c. The disconnecting switch element 56a and the disconnecting switch element 56b are both constituted by P-type field effect transistors, for example.

The configurations of the energy transfer circuit 51 and the disconnecting switch elements 56a and 56b are the same as the configurations of the energy transfer circuit 41 and the disconnecting switch elements 46a and 46b, and will therefore not be described in detail. In other words, the energy transfer circuit 51 has the same configuration as the energy transfer circuit 41 when the switch element 411s provided in the energy transfer circuit 41 is replaced with the switch element 511s, the diode 411d is replaced with the diode 511d, the switch element 413s is replaced with the switch element 513s, and the diode 413d is replaced with the diode 513d; the capacitive load 84 is replaced with the capacitive load 85; the energy transfer unit 411 is replaced with the energy transfer unit 511 and the energy transfer unit 413 is replaced with the energy transfer unit 513; and the control signal generation unit 433 is replaced with the control signal generation unit 533. Additionally, the disconnecting switch element 56a has the same configuration as the disconnecting switch element 46a when the capacitive load 84 is replaced with the capacitive load 85 and the control signal generation unit 433 is replaced with the control signal generation unit 533. The disconnecting switch element 56b has the same configuration as the disconnecting switch element 46b when the capacitive load 84 is replaced with the capacitive load 85 and the control signal generation unit 433 is replaced with the control signal generation unit 533.

The energy transfer circuit 61 and the control circuit 63 provided in the drive circuit 4 will be described next. As illustrated in FIG. 10, the drive circuit 4 includes the control circuit 63, which constitutes a closed circuit 611c (an example of a third closed circuit) together with the inductive element 415 and which controls the application of AC voltage to the capacitive load 86. The drive circuit 4 includes a diode 611d (an example of a third diode-type element) which is connected in series with the inductive element 415 between the capacitive load 86 and the inductive element 415 so as to constitute the closed circuit 611c. The diode 611d is constituted by a PN junction diode, for example. The drive circuit 4 includes a switch element 611s (an example of a third switch element) which is connected in series with the diode 611d between the capacitive load 86 and the inductive element 415 so as to constitute the closed circuit 611c. The switch element 611s is constituted by a P-type field effect transistor, for example.

The drive circuit 4 includes a diode 613d (an example of a fourth diode-type element) which is connected in series with the inductive element 415 and in parallel with the diode 611d and the switch element 611s so as to constitute a closed circuit 613c (an example of a fourth closed circuit). The diode 613d is constituted by a PN junction diode, for example. The drive circuit 4 includes a switch element 613s (an example of a fourth switch element) which is connected in series with the diode 613d and in parallel with the diode 611d and the switch element 611s so as to constitute the closed circuit 613c. The switch element 613s is constituted by a P-type field effect transistor, for example.

The control circuit 63 provided in the drive circuit 4 includes a bridge circuit 631 (an example of a second bridge circuit) which is constituted by a switch element group 631g (an example of a second switch element group) having a plurality of (four, in the present embodiment) switch elements 631ga to 631gd and which is connected to both ends of the capacitive load 86. The control circuit 63 also includes a control signal generation unit 633 (an example of a second control signal generation unit) that generates control signals which control the switching of the plurality of switch elements 631ga to 631gd, the switch element 611s, and the switch element 613s.

The bridge circuit 631 is connected between a supply end 176a (an example of a first supply end) for a positive-side DC potential (an example of a first DC potential) and a supply end 176b (an example of a second supply end) for a reference DC potential (an example of a second DC potential). The positive-side DC potential is a high level-side potential of the voltage generated by the voltage generation circuit 45. The supply end 176b for the reference DC potential is a ground terminal. A reference potential terminal of the voltage generation circuit 45 is connected to this ground terminal. The voltage generated by the voltage generation circuit 45 corresponds to a potential difference between the positive-side DC potential and the reference DC potential. Accordingly, the voltage generated by the voltage generation circuit 45 is applied to both ends of the bridge circuit 631.

The control circuit 63 includes a capacitor 635 provided between the supply end 176a and the supply end 176b. One electrode of the capacitor 635 is connected to the supply end 176a, and another electrode of the capacitor 635 is connected to the supply end 176b. The capacitor 635 is provided in order to prevent fluctuations in the voltage output from the voltage generation circuit 45. Accordingly, an almost constant voltage is supplied to both ends of the bridge circuit 631.

The configuration of the bridge circuit 631 is the same as the configuration of the bridge circuit 431, and will therefore not be described in detail. In other words, the bridge circuit 631 has the same configuration as the bridge circuit 431 when the switch element 431ga provided in the bridge circuit 431 is replaced with the switch element 631ga, the switch element 431gb is replaced with the switch element 631gb, the switch element 431gc is replaced with the switch element 631gc, and the switch element 431gd is replaced with the switch element 631gd; the supply end 174a is replaced with the supply end 176a and the supply end 174b is replaced with the supply end 176b; the capacitive load 84 is replaced with the capacitive load 86, and the control signal generation unit 433 is replaced with the control signal generation unit 633.

As illustrated in FIG. 10, the drive circuit 4 includes an energy transfer unit 611 (an example of a third energy transfer unit) which is constituted by the inductive element 415, the diode 611d, and the switch element 611s, and which transfers energy stored in the capacitive load 86. The drive circuit 4 includes an energy transfer unit 613 (an example of a fourth energy transfer unit) which is constituted by the inductive element 415, the diode 613d, and the switch element 613s, and which transfers energy stored in the capacitive load 86. The drive circuit 4 includes the energy transfer circuit 61 (an example of a second energy transfer circuit), which in turn includes the energy transfer unit 611 and the energy transfer unit 613.

The drive circuit 4 includes disconnecting switch elements 66a and 66b (an example of a second disconnecting switch element), which are connected in series with the capacitive load 86 and the inductive element 415 between the capacitive load 86 and the inductive element 415, and which electrically disconnect the inductive element 415 from the closed circuit 611c. The disconnecting switch element 66a and the disconnecting switch element 66b are both constituted by P-type field effect transistors, for example.

The configurations of the energy transfer circuit 61 and the disconnecting switch elements 66a and 66b are the same as the configurations of the energy transfer circuit 41 and the disconnecting switch elements 46a and 46b, and will therefore not be described in detail. In other words, the energy transfer circuit 61 has the same configuration as the energy transfer circuit 41 when the switch element 411s provided in the energy transfer circuit 41 is replaced with the switch element 611s, the diode 411d is replaced with the diode 611d, the switch element 413s is replaced with the switch element 613s, and the diode 413d is replaced with the diode 613d; the capacitive load 84 is replaced with the capacitive load 86; the energy transfer unit 411 is replaced with the energy transfer unit 611 and the energy transfer unit 413 is replaced with the energy transfer unit 613; and the control signal generation unit 433 is replaced with the control signal generation unit 633. Additionally, the disconnecting switch element 66a has the same configuration as the disconnecting switch element 46a when the capacitive load 84 is replaced with the capacitive load 86 and the control signal generation unit 433 is replaced with the control signal generation unit 633. The disconnecting switch element 66b has the same configuration as the disconnecting switch element 46b when the capacitive load 84 is replaced with the capacitive load 86 and the control signal generation unit 433 is replaced with the control signal generation unit 633.

When the energy is transferred from the capacitive load 85 to the inductive element 415 by the energy transfer circuit 51, the drive circuit 4 sets the disconnecting switch elements 46a and 46b connected to the energy transfer circuit 41 to an off state and sets the disconnecting switch elements 66a and 66b connected to the energy transfer circuit 61 to an off state. Through this, the drive circuit 4 can electrically disconnect the energy transfer circuits 41 and 61 from the inductive element 415, and prevent the occurrence of problems in the transfer of energy from the capacitive load 85 to the inductive element 415 by the energy transfer circuit 51.

When the energy is transferred from the capacitive load 86 to the inductive element 415 by the energy transfer circuit 61, the drive circuit 4 sets the disconnecting switch elements 46a and 46b connected to the energy transfer circuit 41 to an off state and sets the disconnecting switch elements 56a and 56b connected to the energy transfer circuit 51 to an off state. Through this, the drive circuit 4 can electrically disconnect the energy transfer circuits 41 and 51 from the inductive element 415, and prevent the occurrence of problems in the transfer of energy from the capacitive load 86 to the inductive element 415 by the energy transfer circuit 61.

Method of Controlling Drive Circuit

A method of controlling the drive circuit according to the present embodiment will be described next with reference to FIG. 11, while also referring to FIG. 10. The first line in FIG. 11 indicates an example of voltage waveforms of the control signals of the energy transfer circuit 41 and the control circuit 43. The second line in FIG. 11 indicates an example of voltage waveforms of the control signals of the energy transfer circuit 51 and the control circuit 53. The third line in FIG. 11 indicates voltage waveforms of the control signals of the energy transfer circuit 61 and the control circuit 63. In FIG. 11, the passage of time is represented from left to right.

The method of controlling the energy transfer circuit 41 and the control circuit 43 provided in the drive circuit 4 as single units is the same as the method of controlling the drive circuit described in the foregoing first embodiment, with the exception of the gate signal of the switch element 411s. Additionally, the method of controlling the energy transfer circuit 51 and the control circuit 53 provided in the drive circuit 4 as single units is the same as the method of controlling the drive circuit described in the foregoing first embodiment, with the exception of the gate signal of the switch element 511s. Furthermore, the method of controlling the energy transfer circuit 61 and the control circuit 63 provided in the drive circuit 4 as single units is the same as the method of controlling the drive circuit described in the foregoing first embodiment, with the exception of the gate signal of the switch element 611s.

Specifically, the gate signal of the switch element 411s is a signal in which the inversion timing is the same as that of the gate signal of the switch element 111s, but the voltage level is reversed. Likewise, the gate signal of the switch element 511s is a signal in which the inversion timing is the same as that of the gate signal of the switch element 111s, but the voltage level is reversed. Likewise, the gate signal of the switch element 611s is a signal in which the inversion timing is the same as that of the gate signal of the switch element 111s, but the voltage level is reversed. In other words, to describe this with reference to FIG. 4, the gate signals of the switch elements 411s, 511s, and 611s are voltage waveforms which are at high level from time t0 to time t2, low level from time t2 to time t4, and high level from time t4 on. Through this, the energy transfer circuits 41, 51, and 61 provided in the drive circuit 4 can, as single units, operate in the same manner as the energy transfer circuit 11 provided in the drive circuit 1. As a result, the drive circuit 4 can be controlled in the same manner as the drive circuit 1.

The drive circuit 4 includes the three energy transfer circuits 41, 51, and 61. Accordingly, after determining the order in which to drive the capacitive loads 84, 85, and 86, the energy stored in the capacitive loads is transferred to the inductive element 415 on the basis of the determined order. The order in which the capacitive loads are driven will be described below, with the first being the capacitive load 84, the second being the capacitive load 85, and the third being the capacitive load 86.

In the method of controlling the drive circuit 4 according to the present embodiment, the closed circuit to be electrically disconnected from the inductive element 415 is determined on the basis of an initial phase difference between the control signals that control the on state and the off state of the switch elements 511s and 611s of the closed circuits 511c and 611c and the control signals that control the on state and the off state of the switch element 411s of the closed circuit 411c. As described above, the closed circuit 511c is a closed circuit constituted by the inductive element 415, the capacitive load 85, the diode 511d connected in series with the inductive element 415 between the capacitive load 85 and the inductive element 415, and the switch element 511s connected in series with the diode 511d between the capacitive load 85 and the inductive element 415. Additionally, the closed circuit 611c is a closed circuit constituted by the inductive element 415, the capacitive load 86, the diode 611*d* connected in series with the inductive element 415 between the capacitive load 86 and the inductive element 415, and the switch element 611*s* connected in series with the diode 611*d* between the capacitive load 85 and the inductive element 415. The control signal that controls the on state and the off state of the switch element 511*s* is the control signal output from the control signal generation unit 533. Additionally, the control signal that controls the on state and the off state of the switch element 611*s* is the control signal output from the control signal generation unit 633. Furthermore, the control signal that controls the on state and the off state of the switch element 411*s* is the control signal output from the control signal generation unit 433.

Figure 11:
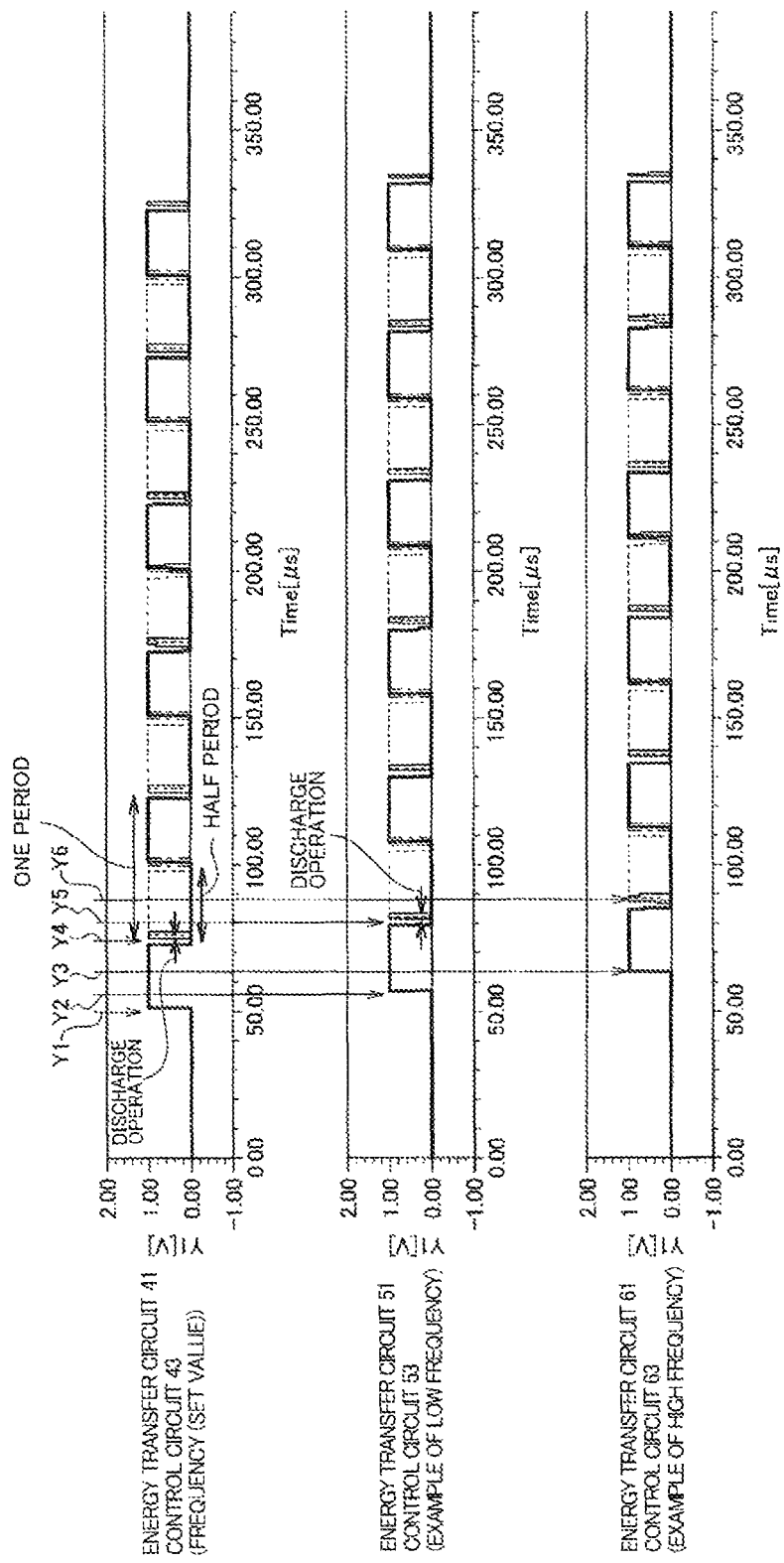
FIG. 11 is a diagram illustrating an example of a control waveform for illustrating a method of controlling the drive circuit according to the fourth embodiment of the present technique.

As indicated by arrows Y1, Y2, and Y3 in FIG. 11, in this example, the phase of the control signal of the switch element 411*s* is the earliest, followed by the phase of the control signal of switch element 511*s*, and the phase of the control signal of switch element 611*s* is the latest. Accordingly, on the basis of the initial phase difference of the switch elements 411*s*, 511*s*, and 611*s*, the drive circuit 4 electrically disconnects the inductive element 415 from the later closed circuits, which are the closed circuits 511*c* and 611*c* including the switch elements 511*s* and 611*s* which, of the switch element 411*s* and the switch elements 511*s* and 611*s*, shift from the off state to the on state later. Specifically, the control circuit 53 outputs a control signal of a voltage level that puts the disconnecting switch elements 56*a* and 56*b* into an off state from the control signal generation unit 533. Likewise, the control circuit 63 outputs a control signal of a voltage level that puts the disconnecting switch elements 66*a* and 66*b* into an off state from the control signal generation unit 633.

In the method of controlling the drive circuit 4, after the closed circuits 511*c* and 611*c* have been disconnected from the inductive element 415, the switch element 411*s*, which constitutes the earlier closed circuit which is the closed circuit 411*c* including the switch element 411*s* which, among the switch element 411*s* and the switch elements 511*s* and 611*s*, shifts from an off state to an on state first, shifts from an off state to an on state. As a result, the energy transfer circuit 41 transfers the energy stored in the capacitive load 84 to the inductive element 415, as indicated by the arrow Y4 in FIG. 11.

In the method of controlling the drive circuit 4, after the energy stored in the capacitive load 84 has begun being transferred to the inductive element 415, the polarity of the voltage applied to the capacitive load 84 constituting the earlier closed circuit is inverted via the closed circuit 411*c*, which is the earlier closed circuit. In this manner, the drive circuit 4 according to the present embodiment can start driving the capacitive load 84 during the transfer of energy from the capacitive load 84 to the inductive element 415.

When the absolute value of the voltage applied to the capacitive load 84 reaches the same magnitude as the voltage output from the voltage generation circuit 45, the switch element 411*s* shifts from an on state to an off state. This completes the discharge operation of the capacitive load 84. The disconnecting switch elements 46*a* and 46*b* then shift from an on state to an off state, and the closed circuit 411*c* is disconnected from the inductive element 415.

After the closed circuit 411*c* has been disconnected from the inductive element 415, the disconnecting switch elements 56*a* and 56*b* shift from an off state to an on state and connect the closed circuit 511*c* to the inductive element 415. Next, the switch element 511*s* of the closed circuit 511*c*, which is a later closed circuit, is shifted from an off state to an on state. As a result, the energy transfer circuit 51 starts transferring the energy stored in the capacitive load 85 to the inductive element 415, as indicated by arrow Y5 in FIG. 11.

In the method of controlling the drive circuit 4, after the transfer of the energy stored in the capacitive load 85 to the inductive element 415 begins, an AC voltage, which has the opposite polarity from the AC voltage applied to the capacitive load 85 that constitutes the later closed circuit, is applied to the capacitive load 85. In this manner, the drive circuit 4 according to the present embodiment can start driving the capacitive load 85 during the transfer of energy from the capacitive load 85 to the inductive element 415.

When the absolute value of the voltage applied to the capacitive load 85 reaches the same magnitude as the voltage output from the voltage generation circuit 45, the switch element 511*s* shifts from an on state to an off state. This completes the discharge operation of the capacitive load 85. The disconnecting switch elements 56*a* and 56*b* then shift from an on state to an off state, and the closed circuit 511*c* is disconnected from the inductive element 415.

After the closed circuit 511*c* has been disconnected from the inductive element 415, the disconnecting switch elements 66*a* and 66*b* shift from an off state to an on state and connect the closed circuit 611*c* to the inductive element 415. Next, the switch element 611*s* of the closed circuit 611*c*, which is a later closed circuit, is shifted from an off state to an on state. As a result, the energy transfer circuit 61 starts transferring the energy stored in the capacitive load 86 to the inductive element 415, as indicated by arrow Y6 in FIG. 11.

In the method of controlling the drive circuit 4, after the transfer of the energy stored in the capacitive load 86 to the inductive element 415 begins, an AC voltage, which has the opposite polarity from the AC voltage applied to the capacitive load 86 that constitutes the later closed circuit, is applied to the capacitive load 86. In this manner, the drive circuit 4 according to the present embodiment can start driving the capacitive load 86 during the transfer of energy from the capacitive load 86 to the inductive element 415.

When the absolute value of the voltage applied to the capacitive load 86 reaches the same magnitude as the voltage output from the voltage generation circuit 45, the switch element 611*s* shifts from an on state to an off state. This completes the discharge operation of the capacitive load 86. The disconnecting switch elements 66*a* and 66*b* then shift from an on state to an off state, and the closed circuit 611*c* is disconnected from the inductive element 415.

Although not illustrated, the closed circuits 413*c*, 513*c*, and 613*c* are disconnected from the inductive element 415 in sequence, and the capacitive loads 84, 85, and 86 are driven, through the same control method as that used for the closed circuits 411*c*, 511*c*, and 611*c*. By repeating the foregoing operations, the drive circuit 4 can sequentially and repeatedly drive the capacitive loads 84, 85, and 86.

The phase difference between the control signals that control the on states and the off states of the switch elements 511*s* and 611*s* of the closed circuits 511*c* and 611*c*, and the control signal that controls the on state and the off state of the switch element 411*s* of the closed circuit 411*c*, increases as the capacitive loads 84, 85, and 86 are repeatedly driven. Likewise, the phase difference between the control signals that control the on states and the off states of the switch elements 513*s* and 613*s* of the closed circuits 513*c* and 613*c*, and the control signal that controls the on state and the off state of the switch element 413*s* of the closed circuit 413*c*, increases as the capacitive loads 84, 85, and 86 are repeatedly driven.

Accordingly, in the method of controlling a drive circuit according to the present embodiment, after applying an AC voltage to the capacitive load 84 constituting the earlier closed circuit and the capacitive loads 85 and 86 constituting the later closed circuits a predetermined number of times, the phase difference between the control signal controlling the switch element 411s and the control signals controlling the switch elements 511s and 611s may be returned to the initial phase difference. Likewise, after applying an AC voltage to the capacitive load 84 constituting the earlier closed circuit and the capacitive loads 85 and 86 constituting the later closed circuits a predetermined number of times, the phase difference between the control signal controlling the switch element 413s and the control signals controlling the switch elements 513s and 613s may be returned to the initial phase difference. This prevents the discharge operation of the capacitive loads (the capacitive loads 85 and 86, in this example) that constitute the later closed circuits (the closed circuits 511c and 611c, in this example) from being started before the driving of the capacitive load (the capacitive load 84, in this example) that makes up the earlier closed circuit (the closed circuit 411c, in this example) ends.

As described above, the drive circuit 4 according to the present embodiment can drive the plurality of capacitive loads 84, 85, and 86. Additionally, the drive circuit 4 can drive the capacitive loads 84, 85, and 86 (invert the applied voltage) during the transfer of energy from the capacitive loads 84, 85, and 86 to the energy transfer circuits 41, 51, and 61. This makes it possible for the drive circuit 4 to reduce the power consumption. The electronic device ED including the drive circuit 4 can also reduce the power consumption.

The present technique is not limited to the foregoing embodiments, and can be varied in many ways. Although the diodes and reverse bias diodes are constituted by PN junction diodes in the foregoing first to fourth embodiments, the present technique is not limited thereto. For example, the diodes and reverse bias diodes may be constituted by diode-connected transistors.

The power source that drives the capacitive loads is not limited to a voltage generation circuit (DC-DC conversion circuit), and may be a voltage output by an op-amp or a digital-analog conversion circuit (DAC).

In the foregoing variation, the voltage level may begin to rise after the first instance of discharging.

In the foregoing first embodiment to fourth embodiment, the supply ends 17a, 174a, 175a, and 176a are terminals to which voltages (high level-side potentials) generated by the voltage generation circuits 15 and 45 are supplied, but the present technique is not limited thereto. For example, 17a, 174a, 175a, and 176a may be terminals to which the power source of the drive circuit 1 is supplied, or terminals connected to the positive electrode of a capacitive element (e.g., a bypass capacitor) corresponding to a fixed potential. Additionally, in the foregoing first embodiment to fourth embodiment, the supply ends 17b, 174b, 175b, and 176b are ground terminals, but the present technique is not limited thereto. For example, the supply ends 17b, 174b, 175b, and 176b may be terminals to which a potential lower than the reference potential (ground potential) is supplied (the potential of the negative electrode). In this case, the supply ends 17a, 174a, 175a, and 176a may be ground terminals, for example.

The present technique can be used in electronic devices such as tactile presentation devices that have low-capacitance or high-frequency circuits and can operate at high speeds. The present technique can also be used in electronic devices (e.g., smartphones, robots, game controllers, and the like) having low capacitances (e.g., approximately 1 µF) where piezoelectric actuators (pumps, vibration devices) can be installed.

5. Application Example

The technique according to the present disclosure can be applied in technologies known as the "Internet of Things" (IoT). IoT is a system in which an IoT device 9100, which corresponds to the "thing", is connected to another IoT device 9003, the Internet, a cloud 9005, and the like, and these are mutually controlled by exchanging information. IoT can be used in a variety of industries, including agriculture, homes, automobiles, manufacturing, distribution, energy, and the like.

Figure 12:
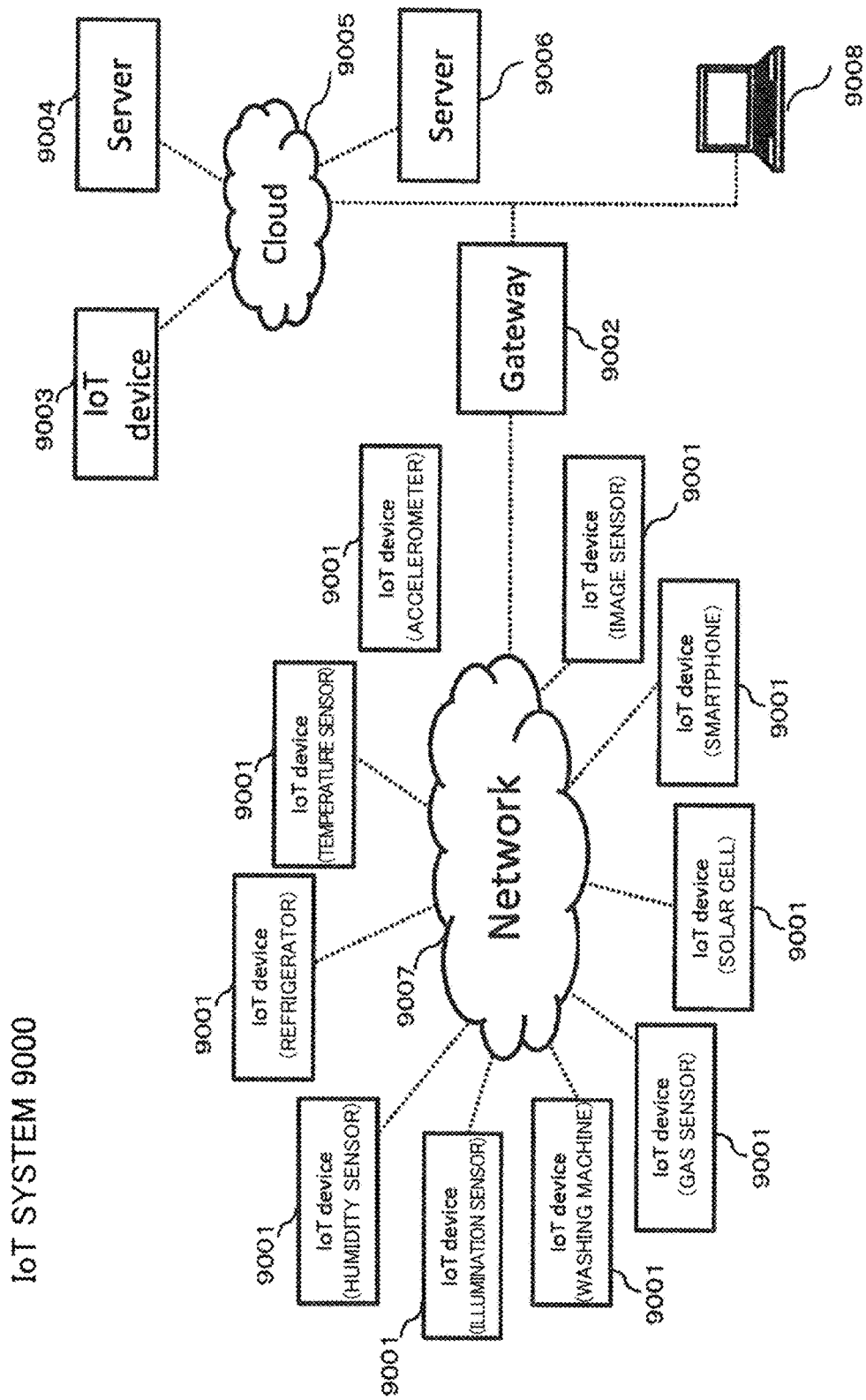
FIG. 12 is a schematic diagram illustrating an example of the configuration of an IoT system 9000 in which the technique according to the present disclosure can be applied.

FIG. 12 is a schematic diagram illustrating an example of the configuration of an IoT system 9000 in which the technique according to the present disclosure can be applied.

IoT devices 9001 include various types of sensors such as a temperature sensor, a humidity sensor, an illumination sensor, an accelerometer, a range sensor, an image sensor, a gas sensor, a motion sensor, and the like. The IoT devices 9001 may also include devices such as smartphones, mobile phones, wearable devices, and game consoles. The IoT devices 9001 are powered by AC power sources, DC power sources, batteries, contactless power supply, what is known as "energy harvesting", and the like. The IoT devices 9001 can communicate through wired, wireless, near-field communication, and the like. 3G/LTE, Wi-Fi, IEEE 802.15.4, Bluetooth (registered trademark), Zigbee (registered trademark), Z-Wave, and the like can be favorably used as the communication method. The IoT devices 9001 may switch among a plurality of these communication methods.

The IoT devices 9001 may form a one-to-one, star-type, tree-type, or mesh-type network. The IoT devices 9001 may be connected to the external cloud 9005 either directly or through a gateway 9002. The IoT devices 9001 are assigned addresses through IPv4, IPv6, 6LoWPAN, or the like. Data collected from the IoT devices 9001 is transmitted to the other IoT device 9003, a server 9004, the cloud 9005, and the like. The timing and frequency of the transmission of data from the IoT devices 9001 may be adjusted as appropriate, and the data may be compressed before transmission. The data may be used as-is, or the data may be analyzed by a computer 9008 using various methods such as statistical analysis, machine learning, data mining, cluster analysis, discriminant analysis, combinatorial analysis, and time-series analysis. The data can be used to provide a variety of services, such as control, alerts, monitoring, visualizing, automation, optimization, and the like.

The technique according to the present disclosure can be applied to devices and services related to homes. IoT devices 9001 in the home include washing machines, clothes dryers, hair dryers, microwave ovens, dishwashers, refrigerators, ovens, rice cookers, cooking equipment, gas appliances, fire alarms, thermostats, air conditioners, TVs, video recorders, audio devices, lighting equipment, water heaters, hot water supply equipment, vacuum cleaners, fans, air purifiers, security cameras, locks, door and shutter openers, sprinklers, toilets, thermometers, scales, blood pressure monitors, and the like. Furthermore, the IoT devices 9001 may include solar cells, fuel cells, storage batteries, gas meters, electricity meters, and distribution boards.

It is desirable that the communication method for the IoT devices 9001 in the home be a low power consumption-type communication method. The IoT devices 9001 may also communicate over Wi-Fi indoors and 3G/LTE outdoors. An external server 9006 for IoT device control may be set up on the cloud 9005 to control the IoT devices 9001. The IoT devices 9001 transmit data on the status of household equipment, temperature, humidity, power usage, presence or absence of people/animals inside or outside the house, and the like. The data transmitted from the household equipment is stored on the external server 9006 via the cloud 9005. New services are provided on the basis of such data. Such IoT devices 9001 can be controlled by voice by using voice recognition technology.

Also, by transmitting information directly from the various types of household equipment to a TV, the statuses of the various types of household equipment can be visualized. Furthermore, various types of sensors can determine the presence or absence of occupants and send the data to air conditioners, lighting, and the like to turn those devices on and off. Further still, advertisements can be displayed in the displays of the various types of household equipment over the Internet.

The foregoing describes an example of an IoT system 9000 to which the technique of the present disclosure can be applied. The technique of the present disclosure can be applied favorably in the IoT devices 9001 in the configuration described above. Specifically, the electronic device ED can be applied in the IoT devices 9001. By applying the technique of the present disclosure to the IoT devices 9001, the power consumption can be reduced and the battery life of the IoT devices 9001 can be extended.

Note that the embodiments described above are examples of embodiments of the present technique, and the items in the embodiments correspond to the items specifying the invention set forth in the scope of claims. Likewise, the items specifying the invention set forth in the scope of claims correspond to the items in the embodiments of the present technique which have the same names. However, the present technique is not limited to the embodiments, and can be embodied by making various modifications to the embodiments within a scope that does not depart from the essential spirit thereof.

Note that the present technique can also take on configurations such as those described below.

(1) A drive circuit including;
a first control circuit that controls application of an AC voltage to a first capacitive load;
an inductive element that constitutes a first closed circuit together with the first capacitive load;
a first diode-type element that is connected in series with the inductive element between the first capacitive load and the inductive element so as to constitute the first closed circuit; and
a first switch element that is connected in series with the first diode-type element between the first capacitive load and the inductive element so as to constitute the first closed circuit.

(2) The drive circuit according to (1), including;
a first reverse bias diode-type element which is connected between a first supply end for a first DC potential and a point between the first capacitive load and the inductive element, and to which a reverse bias is applied by the first DC potential; and
a second reverse bias diode-type element which is connected between a second supply end for a second DC potential and a point between the first capacitive load and the inductive element, and to which a reverse bias is applied by the second DC potential.

(3) The drive circuit according to (2), including;
a second diode-type element that is connected in series with the inductive element and in parallel with the first diode-type element and the first switch element so as to constitute a second closed circuit; and
a second switch element that is connected in series with the second diode-type element and in parallel with the first diode-type element and the first switch element so as to constitute the first closed circuit.

(4) The drive circuit according to (3), wherein the first closed circuit and the second closed circuit are not directly connected to the first supply end and the second supply end.

(5) The drive circuit according to (3) or (4), wherein the first control circuit includes;
a first bridge circuit that is constituted by a first switch element group having a plurality of switch elements and that is connected to both ends of the first capacitive load; and
a first control signal generation unit that generates control signals that control switching of the plurality of switch elements, the first switch element, and the second switch element.

(6) The drive circuit according to (5), including:
an energy transfer circuit including:
a first energy transfer unit that is constituted by the inductive element, the first diode-type element, and the first switch element, and that transfers energy stored in the first capacitive load; and
a second energy transfer unit that is constituted by the inductive element, the second diode-type element, and the second switch element, and that transfers energy stored in the first capacitive load.

(7) The drive circuit according to (5) or (6), wherein the first switch element, the second switch element, and the plurality of switch elements provided in the first switch element group are constituted by field effect transistors.

(8) The drive circuit according to any one of (3) to (7), including:
a second control circuit that controls application of an AC voltage to a second capacitive load;
a third diode-type element that is connected in series with the inductive element between the second capacitive load and the inductive element so as to constitute a third closed circuit;
a third switch element that is connected in series with the third diode-type element between the second capacitive load and the inductive element so as to constitute the third closed circuit;
a first disconnecting switch element that is connected in series with the first capacitive load and the inductive element between the first capacitive load and the inductive element, and that electrically disconnects the inductive element from the first closed circuit and the second closed circuit; and
a second disconnecting switch element that is connected in series with the second capacitive load and the inductive element between the second capacitive load and the inductive element, and that electrically disconnects the inductive element from the third closed circuit.

(9) The drive circuit according to (8), including:
a fourth diode-type element that is connected in series with the inductive element and in parallel with the third diode-type element and the third switch element so as to constitute a fourth closed circuit; and
a fourth switch element that is connected in series with the fourth diode-type element and in parallel with the third diode-type element and the third switch element so as to constitute the fourth closed circuit.

(10) The drive circuit according to (9), wherein
the second control circuit includes:
a second bridge circuit that is constituted by a second switch element group having a plurality of switch elements and that is connected to both ends of the second capacitive load; and
a second control signal generation unit that generates control signals that control switching of the third switch element, the fourth switch element, and the second switch element group.

(11) The drive circuit according to (9) or (10), including:
a second energy transfer circuit including:
a third energy transfer unit that is constituted by the inductive element, the third diode-type element, and the third switch element, and that transfers energy stored in the second capacitive load; and
a fourth energy transfer unit that is constituted by the inductive element, the fourth diode-type element, and the fourth switch element, and that transfers energy stored in the second capacitive load.

(12) The drive circuit according to (10) or (11), wherein
the third switch element, the fourth switch element, and the plurality of switch elements provided in the second switch element group are constituted by field effect transistors.

(13) An electronic device including the drive circuit according to any one of (1) to (12).

(14) A method of controlling a drive circuit, the method including:
in a first closed circuit constituted by an inductive element connected in series with a first capacitive load, a first diode-type element connected in series with the inductive element between the first capacitive load and the inductive element, and a first switch element connected in series with the first diode-type element between the first capacitive load and the inductive element, shifting the first switch element from an off state to an on state;
inverting, via the first closed circuit, a polarity of a voltage applied to the first capacitive load;
shifting the first switch element from the on state to the off state; and applying, from the first control circuit, an AC voltage of a same polarity as the voltage applied to the first capacitive load.

(15) The method of controlling a drive circuit according to (14), wherein after the AC voltage of the same polarity is applied to the first capacitive load from the first control circuit,
a second switch element among a second diode-type element and the second switch element which are connected in series with the inductive element and in parallel with the first diode-type element and the first switch element so as to constitute a second closed circuit and which are connected with each other in series is shifted from an off state to an on state,
a polarity of a voltage applied to the first capacitive load is inverted via the second closed circuit,
the second switch element is shifted from the on state to the off state, and an AC voltage of a same polarity as the voltage applied to the first capacitive load is applied from the first control circuit.

(16) The method of controlling a drive circuit according to (14) or (15), wherein
the first control circuit applies the AC voltage to the first capacitive load with a voltage level of the AC voltage set to a lower voltage level a first time than a voltage level second and subsequent times.

(17) The method of controlling a drive circuit according to any one of (14) to (16), wherein
a third closed circuit is constituted by the inductive element, the second capacitive load, a third diode-type element connected in series with the inductive element between the second capacitive load and the inductive element, and a third switch element connected in series with the third diode-type element between the second capacitive load and the inductive element, and on the basis of an initial phase difference between a control signal that controls an on state and an off state of the third switch element and a control signal that controls an on state and an off state of the first switch element, the inductive element is electrically disconnected from a later closed circuit that is a closed circuit including the switch element, among the first switch element and the third switch element, that shifts from the off state to the on state later, a switch element constituting an earlier closed circuit that is a closed circuit including the switch element, among the first switch element and the third switch element, that shifts from the off state to the on state earlier, is shifted from the off state to the on state,
a polarity of a voltage applied to a capacitive load constituting the earlier closed circuit is inverted via the earlier closed circuit,
an AC voltage of an opposite polarity from the AC voltage applied to a capacitive load constituting the later closed circuit is applied to the capacitive load, and the switch element constituting the later closed circuit is shifted from the on state to the off state.

(18) The method of controlling a drive circuit according to (17), wherein after applying an AC voltage to the capacitive load constituting the earlier closed circuit and the capacitive load constituting the later closed circuit a predetermined number of times, a phase difference between the control signal controlling the first switch element and the control signal controlling the third switch element is returned to the initial phase difference.

REFERENCE SIGNS LIST 1, 2, 3, 4 Drive circuit
8, 84, 85, 86 Capacitive load
9 Battery
11, 31, 41, 51, 61 Energy transfer circuit
13, 43, 53, 63 Control circuit
15, 45 Voltage generation circuit
17a, 17b, 174a, 174b, 175a, 175b, 176a, 176b Supply end
46a, 46b, 56a, 56b, 66a, 66b Disconnecting switch element
111, 113, 311, 313, 411, 413, 511, 513, 611, 613 Energy transfer unit
111c, 113c, 311c, 313c, 411c, 413c, 415c, 511c, 513c, 611c, 613c Closed circuit
111d, 113d, 311d, 313d, 411d, 413d, 511d, 513d, 611d, 613d Diode
111s, 113s, 131ga, 131gb, 131gc, 131gd, 311s, 313s, 411s, 413s, 431ga, 431gb, 431gc, 431gd, 511s, 513s, 531ga, 531gb, 531gc, 531gd, 611s, 613s, 631ga, 631gb, 631gc, 631gd Switch element
115, 415 Inductive element
117, 119, 217, 219, 317, 319, 417a, 417b, 419, 419a, 419b Reverse bias diode
131, 431, 531, 631 Bridge circuit
131g, 431g, 531g, 631g Switch element group
133, 433, 533, 633 Control signal generation unit
135, 435, 535, 635 Capacitor 9000 System
9001 Device
9002 Gateway
9003 Device
9004 Server
9005 Cloud
9006 External server
9008 Computer
9100 Device
ED Electronic device

The invention claimed is:

1. A drive circuit comprising:
a first control circuit that controls application of an AC voltage to a first capacitive load;
an inductive element that constitutes a first closed circuit together with the first capacitive load;
a first diode-type element that is connected in series with the inductive element between the first capacitive load and the inductive element so as to constitute the first closed circuit;
a first switch element that is connected in series with the first diode-type element between the first capacitive load and the inductive element so as to constitute the first closed circuit;
a first reverse bias diode-type element which is connected between a first supply end for a first DC potential and a point between the first capacitive load and the inductive element, and to which a reverse bias is applied by the first DC potential; and
a second reverse bias diode-type element which is connected between a second supply end for a second DC potential and a point between the first capacitive load and the inductive element, and to which a reverse bias is applied by the second DC potential.

2. The drive circuit according to claim 1, comprising:
a second diode-type element that is connected in series with the inductive element and in parallel with the first diode-type element and the first switch element so as to constitute a second closed circuit; and
a second switch element that is connected in series with the second diode-type element and in parallel with the first diode-type element and the first switch element so as to constitute the first closed circuit.

3. The drive circuit according to claim 2, wherein the first closed circuit and the second closed circuit are not directly connected to the first supply end and the second supply end.

4. The drive circuit according to claim 2, wherein the first control circuit includes:
a first bridge circuit that is constituted by a first switch element group having a plurality of switch elements and that is connected to both ends of the first capacitive load; and
a first control signal generation unit that generates control signals that control switching of the plurality of switch elements, the first switch element, and the second switch element.

5. The drive circuit according to claim 4, comprising:
an energy transfer circuit including:
a first energy transfer unit that is constituted by the inductive element, the first diode-type element, and the first switch element, and that transfers energy stored in the first capacitive load; and
a second energy transfer unit that is constituted by the inductive element, the second diode-type element, and the second switch element, and that transfers energy stored in the first capacitive load.

6. The drive circuit according to claim 4, wherein the first switch element, the second switch element, and the plurality of switch elements provided in the first switch element group are constituted by field effect transistors.

7. The drive circuit according to claim 2, comprising:
a second control circuit that controls application of an AC voltage to a second capacitive load;
a third diode-type element that is connected in series with the inductive element between the second capacitive load and the inductive element so as to constitute a third closed circuit;
a third switch element that is connected in series with the third diode-type element between the second capacitive load and the inductive element so as to constitute the third closed circuit;
a first disconnecting switch element that is connected in series with the first capacitive load and the inductive element between the first capacitive load and the inductive element, and that electrically disconnects the inductive element from the first closed circuit and the second closed circuit; and
a second disconnecting switch element that is connected in series with the second capacitive load and the inductive element between the second capacitive load and the inductive element, and that electrically disconnects the inductive element from the third closed circuit.

8. The drive circuit according to claim 7, comprising:
a fourth diode-type element that is connected in series with the inductive element and in parallel with the third diode-type element and the third switch element so as to constitute a fourth closed circuit; and
a fourth switch element that is connected in series with the fourth diode-type element and in parallel with the third diode-type element and the third switch element so as to constitute the fourth closed circuit.

9. The drive circuit according to claim 8, wherein the second control circuit includes:
a second bridge circuit that is constituted by a second switch element group having a plurality of switch elements and that is connected to both ends of the second capacitive load; and
a second control signal generation unit that generates control signals that control switching of the third switch element, the fourth switch element, and the second switch element group.

10. The drive circuit according to claim 8, comprising:
a second energy transfer circuit including:
a third energy transfer unit that is constituted by the inductive element, the third diode-type element, and the third switch element, and that transfers energy stored in the second capacitive load; and
a fourth energy transfer unit that is constituted by the inductive element, the fourth diode-type element, and the fourth switch element, and that transfers energy stored in the second capacitive load.

11. The drive circuit according to claim 9, wherein the third switch element, the fourth switch element, and the plurality of switch elements provided in the second switch element group are constituted by field effect transistors.

12. An electronic device comprising the drive circuit according to claim 1.

13. A method of controlling a drive circuit, the method comprising:
in a first closed circuit constituted by an inductive element connected in series with a first capacitive load, a first diode-type element connected in series with the inductive element between the first capacitive load and the inductive element, and a first switch element connected in series with the first diode-type element between the first capacitive load and the inductive element, shifting the first switch element from an off state to an on state;

inverting, via the first closed circuit, a polarity of a voltage applied to the first capacitive load;

shifting the first switch element from the on state to the off state; and applying, from the first control circuit, an AC voltage of a same polarity as the voltage applied to the first capacitive load, wherein the first control circuit applies the AC voltage to the first capacitive load with a voltage level of the AC voltage set to a lower voltage level a first time than a voltage level second and subsequent times.

14. The method of controlling a drive circuit according to claim 13, wherein after the AC voltage of the same polarity is applied to the first capacitive load from the first control circuit, a second switch element among a second diode-type element and the second switch element which are connected in series with the inductive element and in parallel with the first diode-type element and the first switch element so as to constitute a second closed circuit and which are connected with each other in series is shifted from an off state to an on state, a polarity of a voltage applied to the first capacitive load is inverted via the second closed circuit, the second switch element is shifted from the on state to the off state, and an AC voltage of a same polarity as the voltage applied to the first capacitive load is applied from the first control circuit.

15. The method of controlling a drive circuit according to claim 13, wherein a third closed circuit is constituted by the inductive element, the second capacitive load, a third diode-type element connected in series with the inductive element between the second capacitive load and the inductive element, and a third switch element connected in series with the third diode-type element between the second capacitive load and the inductive element, and on the basis of an initial phase difference between a control signal that controls an on state and an off state of the third switch element and a control signal that controls an on state and an off state of the first switch element, the inductive element is electrically disconnected from a later closed circuit that is a closed circuit including the switch element, among the first switch element and the third switch element, that shifts from the off state to the on state later, a switch element constituting an earlier closed circuit that is a closed circuit including the switch element, among the first switch element and the third switch element, that shifts from the off state to the on state earlier, is shifted from the off state to the on state, a polarity of a voltage applied to a capacitive load constituting the earlier closed circuit is inverted via the earlier closed circuit, an AC voltage of an opposite polarity from the AC voltage applied to a capacitive load constituting the later closed circuit is applied to the capacitive load, and the switch element constituting the later closed circuit is shifted from the on state to the off state.

16. The method of controlling a drive circuit according to claim 15, wherein after applying an AC voltage to the capacitive load constituting the earlier closed circuit and the capacitive load constituting the later closed circuit a predetermined number of times, a phase difference between the control signal controlling the first switch element and the control signal controlling the third switch element is returned to the initial phase difference.

* * * * *